US012520636B2

(12) United States Patent
Onuma et al.

(10) Patent No.: US 12,520,636 B2
(45) Date of Patent: Jan. 6, 2026

(54) MICRO LIGHT-EMITTING ELEMENT AND IMAGE DISPLAY ELEMENT

(71) Applicant: Sharp Fukuyama Laser Co., Ltd., Fukuyama (JP)

(72) Inventors: Hiroaki Onuma, Fukuyama (JP); Kentaro Kubota, Fukuyama (JP); Masumi Maegawa, Fukuyama (JP); Katsuji Iguchi, Fukuyama (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 572 days.

(21) Appl. No.: 17/890,179

(22) Filed: Aug. 17, 2022

(65) Prior Publication Data

US 2023/0109233 A1    Apr. 6, 2023

(30) Foreign Application Priority Data

Oct. 5, 2021    (JP) .................................. 2021-163992

(51) Int. Cl.
   H10H 20/851    (2025.01)
   G09G 3/32    (2016.01)
   H10H 29/14    (2025.01)

(52) U.S. Cl.
   CPC .......... H10H 20/8512 (2025.01); G09G 3/32 (2013.01); H10H 29/142 (2025.01); *G09G 2300/0426* (2013.01); *G09G 2300/0452* (2013.01)

(58) Field of Classification Search
   CPC ............. H10H 20/8512; H10H 29/142; H10H 20/8513; H10H 20/8515; H10H 20/841; G09G 3/32; G09G 2300/0426; G09G 2300/0452; H01L 25/0753
   See application file for complete search history.

(56) References Cited

U.S. PATENT DOCUMENTS

| 10,193,042 | B1* | 1/2019 | Tsai ....................... H10D 86/60 |
| 2004/0065877 | A1 | 4/2004 | Hayashi et al. |
| 2015/0311470 | A1 | 10/2015 | Guimard et al. |
| 2017/0242179 | A1* | 8/2017 | Satake ................... G02F 1/1336 |
| 2019/0041733 | A1* | 2/2019 | Takagi .................... C03C 27/00 |
| 2019/0131492 | A1 | 5/2019 | Kang et al. |
| 2021/0020619 | A1 | 1/2021 | Iguchi et al. |

FOREIGN PATENT DOCUMENTS

| JP | 2002-141492 A | 5/2002 |
| JP | 2002237390 A | 8/2002 |
| JP | 2016506037 A | 2/2016 |
| JP | 2016-103461 A | 6/2016 |
| JP | 2020092231 A | 6/2020 |
| JP | 2021019015 A | 2/2021 |
| KR | 20190046423 A | 5/2019 |
| WO | 2012132236 A1 | 10/2012 |

* cited by examiner

*Primary Examiner* — Jonathan Han
(74) *Attorney, Agent, or Firm* — ScienBiziP, P.C.

(57) ABSTRACT

A micro light-emitting element includes: a micro light-emitting diode (LED) element configured to emit excitation light; and a wavelength conversion portion containing a nano particle configured to absorb the excitation light to emit light having a longer wavelength than the excitation light. The wavelength conversion portion has, on at least a light emitting surface of the wavelength conversion portion, a stack of one or more layers including an oxygen absorption film.

16 Claims, 12 Drawing Sheets

FIG. 1

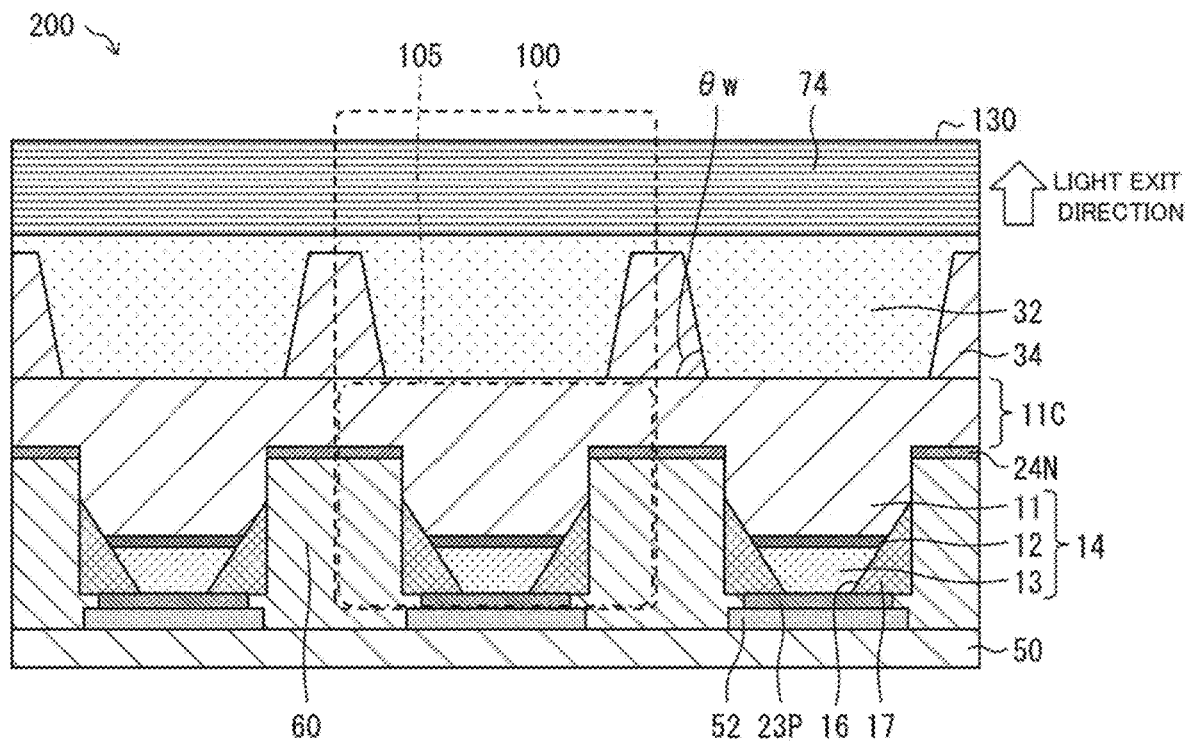

11: N-SIDE LAYER
11C: CONTINUOUS N-SIDE LAYER
12: LIGHT EMISSION LAYER
13: P-SIDE LAYER
14: NITRIDE SEMICONDUCTOR LAYER
16: MESA
17: PROTECTIVE FILM
23P: P-ELECTRODE
24N: N-ELECTRODE
32: RED-WAVELENGTH CONVERSION PORTION
34: PARTITION WALL
50: DRIVING CIRCUIT SUBSTRATE
52: P-DRIVE ELECTRODE
60: FILLER
74: DIELECTRIC MULTI-LAYER FILM
100: MICRO LIGHT-EMITTING ELEMENT
105: EXCITATION-LIGHT-EMITTING ELEMENT
130: LIGHT EMITTING SURFACE
200: IMAGE DISPLAY ELEMENT
$\theta w$: INCLINATION ANGLE 32: RED-WAVELENGTH CONVERSION PORTION
74: DIELECTRIC MULTI-LAYER FILM
75: AZO FILM

FIG. 10

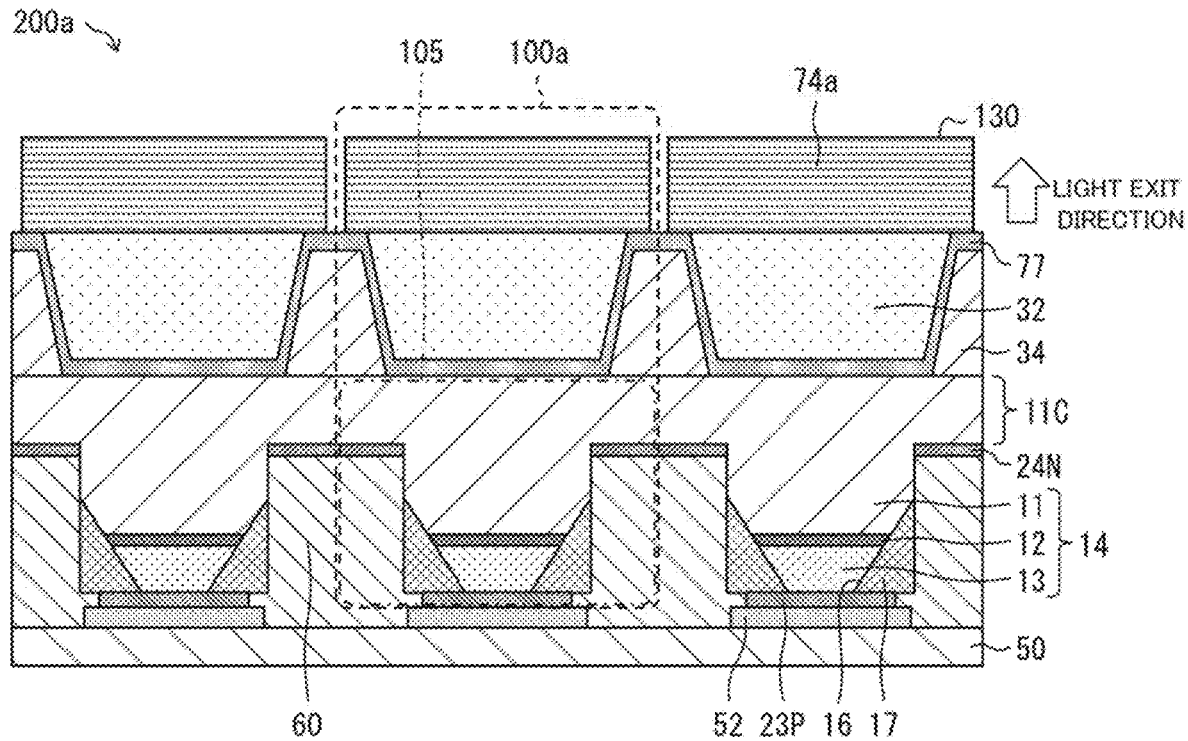

11: N-SIDE LAYER
11C: CONTINUOUS N-SIDE LAYER
12: LIGHT EMISSION LAYER
13: P-SIDE LAYER
14: NITRIDE SEMICONDUCTOR LAYER
16: MESA
17: PROTECTIVE FILM
23P: P-ELECTRODE
24N: N-ELECTRODE
32: RED-WAVELENGTH CONVERSION PORTION
34: PARTITION WALL
50: DRIVING CIRCUIT SUBSTRATE
52: P-DRIVE ELECTRODE
60: FILLER
74a: DIELECTRIC MULTI-LAYER FILM
77: SECOND AZO FILM
100a: MICRO LIGHT-EMITTING ELEMENT
105: EXCITATION-LIGHT-EMITTING ELEMENT
130: LIGHT EMITTING SURFACE
200a: IMAGE DISPLAY ELEMENT

FIG. 11

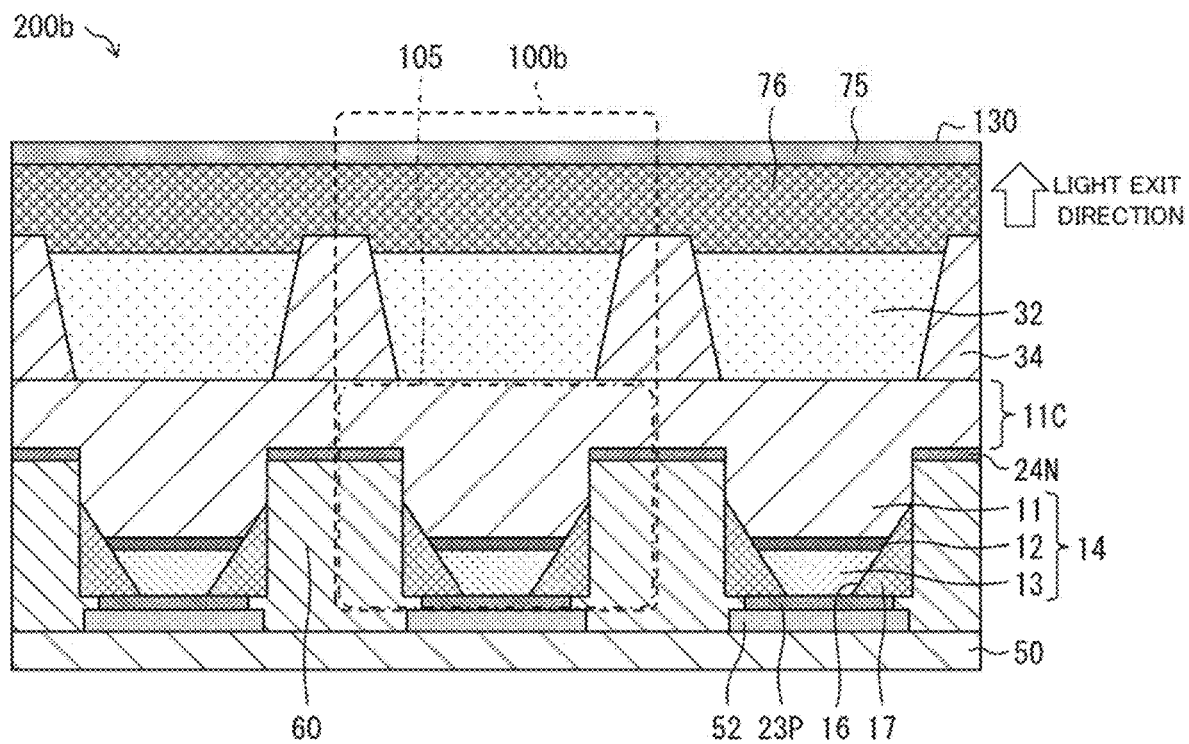

11: N-SIDE LAYER
11C: CONTINUOUS N-SIDE LAYER
12: LIGHT EMISSION LAYER
13: P-SIDE LAYER
14: NITRIDE SEMICONDUCTOR LAYER
16: MESA
17: PROTECTIVE FILM
23P: P-ELECTRODE
24N: N-ELECTRODE
32: RED-WAVELENGTH CONVERSION PORTION
34: PARTITION WALL
50: DRIVING CIRCUIT SUBSTRATE
52: P-DRIVE ELECTRODE
60: FILLER
75: AZO FILM
76: NANO PARTICLE FILM
100b: MICRO LIGHT-EMITTING ELEMENT
105: EXCITATION-LIGHT-EMITTING ELEMENT
130: LIGHT EMITTING SURFACE
200b: IMAGE DISPLAY ELEMENT

FIG. 13

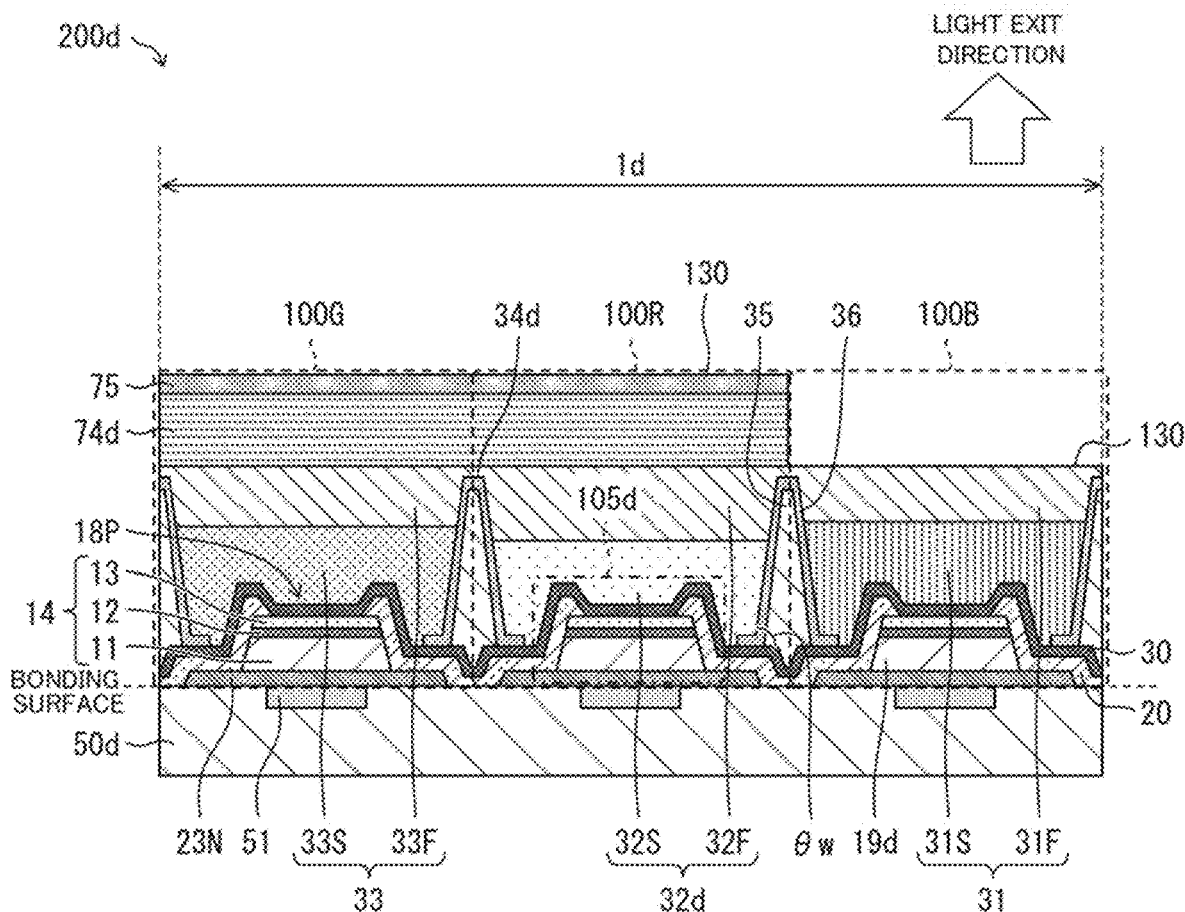

| | |
|---|---|
| 1d: PIXEL REGION | 33S: SECOND LAYER |
| 11: N-SIDE LAYER | 34d: PARTITION WALL |
| 12: LIGHT EMISSION LAYER | 35: PARTITION-WALL BASE MATERIAL |
| 13: P-SIDE LAYER | 36: PARTITION-WALL REFLECTOR |
| 14: NITRIDE SEMICONDUCTOR LAYER | 50d: DRIVING CIRCUIT SUBSTRATE |
| 18P: P-CONTACT HOLE | 51: N-DRIVE ELECTRODE |
| 19d: BODY | 74d: DIELECTRIC MULTI-LAYER FILM |
| 20: TRANSPARENT INSULATING FILM | 75: AZO FILM |
| 23N: N-ELECTRODE | 100B: BLUE MICRO LIGHT-EMITTING ELEMENT |
| 30: TRANSPARENT ELECTRODE | 100G: GREEN MICRO LIGHT-EMITTING ELEMENT |
| 31: TRANSPARENT PORTION | 100R: RED MICRO LIGHT-EMITTING ELEMENT |
| 31F: FIRST LAYER | 105d: EXCITATION-LIGHT-EMITTING ELEMENT |
| 31S: SECOND LAYER | 130: LIGHT EMITTING SURFACE |
| 32d: RED-WAVELENGTH CONVERSION PORTION | 200d: IMAGE DISPLAY ELEMENT |
| 32F: FIRST LAYER | $\theta$w: INCLINATION ANGLE |
| 32S: SECOND LAYER | |
| 33: GREEN-WAVELENGTH CONVERSION PORTION | |
| 33F: FIRST LAYER | |

FIG. 14

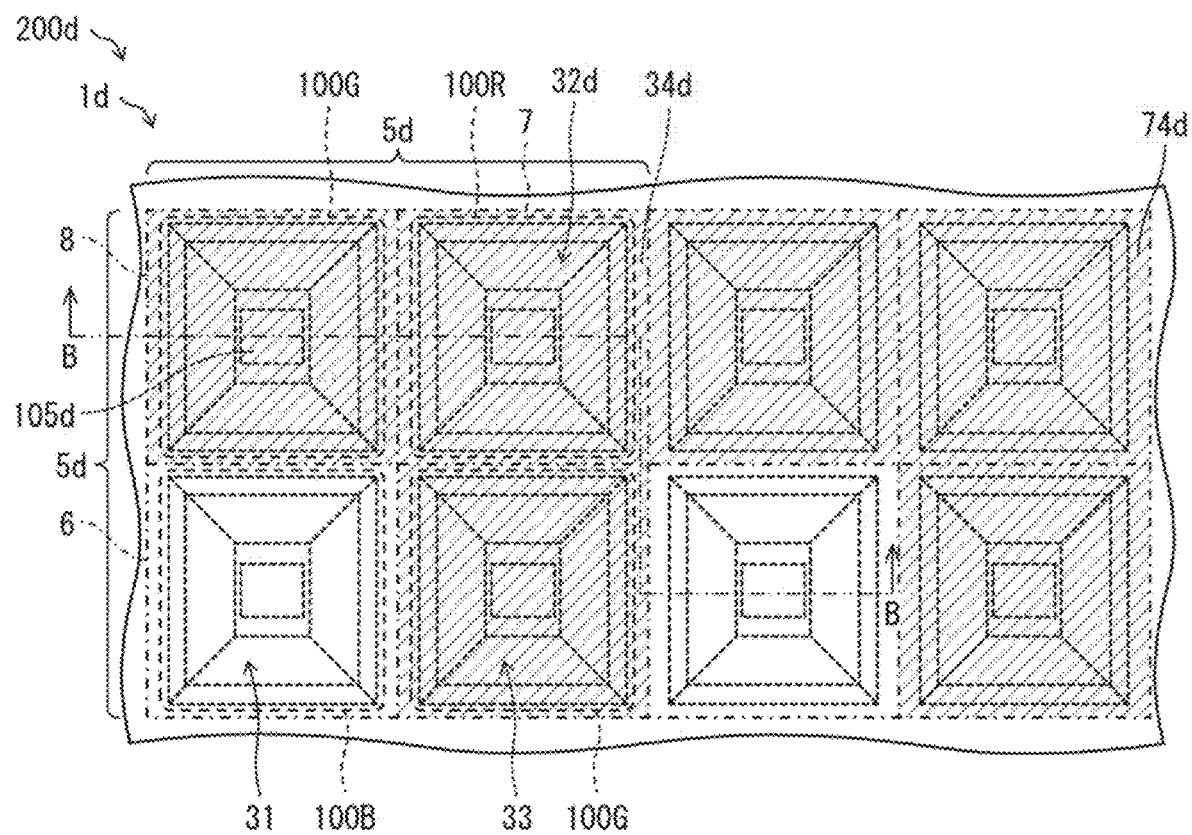

1d: PIXEL REGION
5d: PIXEL
6: BLUE SUB-PIXEL
7: RED SUB-PIXEL
8: GREEN SUB-PIXEL
31: TRANSPARENT PORTION
32d: RED-WAVELENGTH CONVERSION POTION
33: GREEN-WAVELENGTH CONVERSION POTION
34d: PARTITION WALL
74d: DIELECTRIC MULTI-LAYER FILM
100B: BLUE MICRO LIGHT-EMITTING ELEMENT
100G: GREEN MICRO LIGHT-EMITTING ELEMENT
100R: RED MICRO LIGHT-EMITTING ELEMENT
105d: EXCITATION-LIGHT-EMITTING ELEMENT
200d: IMAGE DISPLAY ELEMENT

FIG. 15

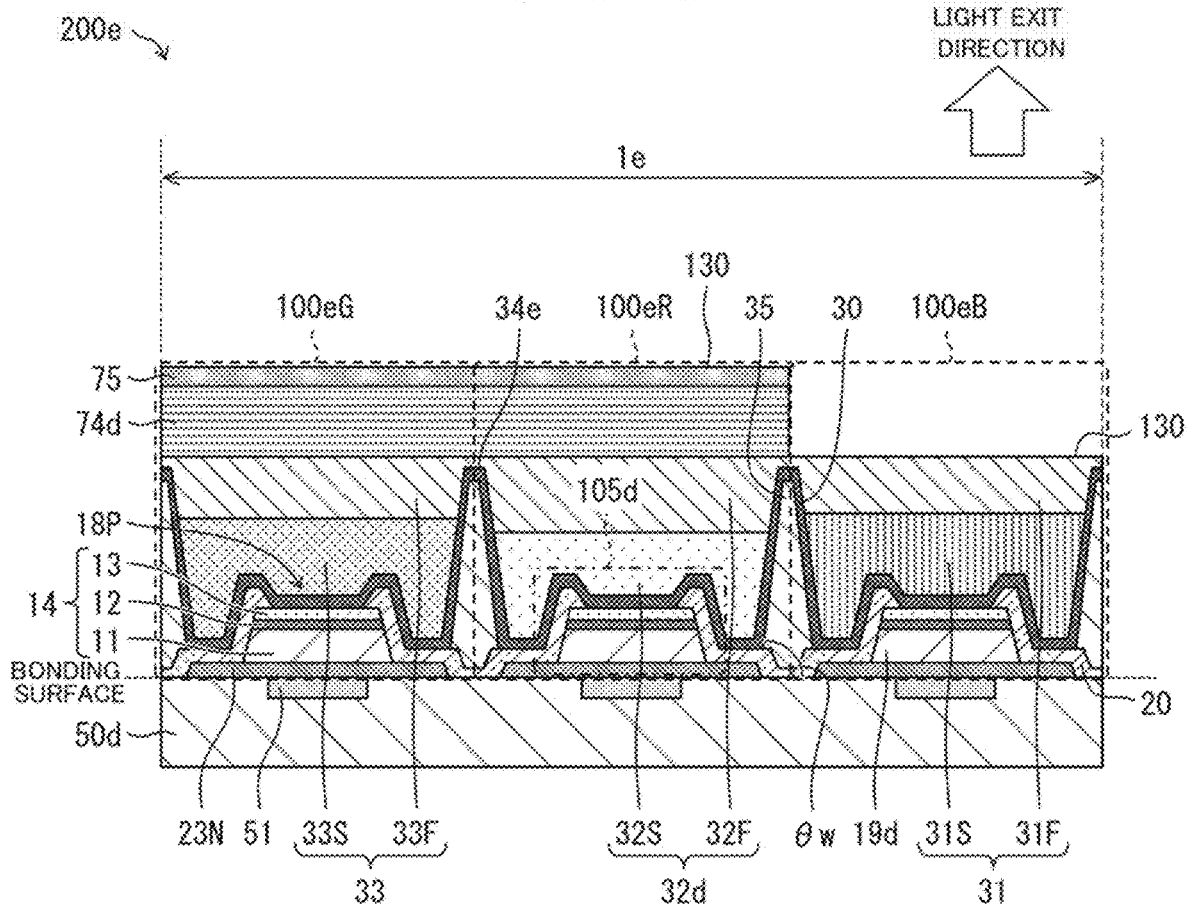

| | |
|---|---|
| 1e: PIXEL REGION | 33S: SECOND LAYER |
| 11: N-SIDE LAYER | 34e: PARTITION WALL |
| 12: LIGHT EMISSION LAYER | 35: PARTITION-WALL BASE MATERIAL |
| 13: P-SIDE LAYER | 50d: DRIVING CIRCUIT SUBSTRATE |
| 14: NITRIDE SEMICONDUCTOR LAYER | 51: N-DRIVE ELECTRODE |
| 18P: P-CONTACT HOLE | 74d: DIELECTRIC MULTI-LAYER FILM |
| 19d: BODY | 75: AZO FILM |
| 20: TRANSPARENT INSULATING FILM | 100eB: BLUE MICRO LIGHT-EMITTING ELEMENT |
| 23N: N-ELECTRODE | |
| 30: TRANSPARENT ELECTRODE | 100eG: GREEN MICRO LIGHT-EMITTING ELEMENT |
| 31: TRANSPARENT PORTION | |
| 31F: FIRST LAYER | 100eR: REF MICRO LIGHT-EMITTING ELEMENT |
| 31S: SECOND LAYER | |
| 32d: RED-WAVELENGTH CONVERSION PORTION | 105d: EXCITATION-LIGHT-EMITTING ELEMENT |
| 32F: FIRST LAYER | 130: LIGHT EMITTING SURFACE |
| 32S: SECOND LAYER | 200e: IMAGE DISPLAY ELEMENT |
| 33: GREEN-WAVELENGTH CONVERSION PORTION | $\theta w$: INCLINATION ANGLE |
| 33F: FIRST LAYER | |

MICRO LIGHT-EMITTING ELEMENT AND IMAGE DISPLAY ELEMENT

CROSS-REFERENCE TO RELATED APPLICATION

The present application claims priority from Japanese Patent Application Number 2021-163992, the content of which is hereby incorporated by reference into this application.

BACKGROUND OF THE INVENTION

1. Field of the Invention

One aspect of the present invention relates to a micro light-emitting element and an image display element including a micro light-emitting element.

2. Description of the Related Art

A conventionally proposed display element has a driving circuit substrate on which a plurality of micro light-emitting elements constituting pixels are disposed. In a technique disclosed in Japanese Unexamined Patent Application Publication No. 2002-141492 for instance, a driving circuit is formed on a silicon substrate, and an array of micro light-emitting diodes (micro LEDs) that emit ultraviolet light is disposed on the driving circuit. Further, in this technique, a small display element is disclosed that includes a wavelength conversion portion provided on a light-emitting diode array and configured to convert ultraviolet light into red, green and blue visible light, to thus display a color image.

Such a combination of a micro LED and wavelength conversion portion, which constitutes a micro light-emitting element, as disclosed in Japanese Unexamined Patent Application Publication No. 2002-141492 facilitates achieving a full-color display element. Further, using a nitride semiconductor as a material for a micro LED can achieve a display element with less efficiency reduction resulting from temperature rise and with high durability. Such a display element is hence promising as a display element for displays, including glasses-like devices and head-up displays (HUDs).

Attention has been drawn to a nano material having high conversion efficiency and having a narrow full-width with half-maximum (FWHM) of a light emission spectrum, including quantum dots (QDs) and quantum rods (QRs), as a material that constitutes the wavelength conversion portion. This is because that such a nano material has a wide display color gamut and can achieve a high color rendering property.

Intrusion of moisture and oxygen needs to be prevented in order to use nano materials such as quantum dots stably. For application to the backlight of a liquid crystal display, a stacked structure of a barrier film and a getter layer has been proposed, like that in Japanese Unexamined Patent Application Publication No. 2016-103461.

The inventors have studied to find that nano materials that are used for the wavelength conversion portion deteriorates easily in the manufacture of a micro display for a glasses-like device. That is, before addressing age deterioration, their study has revealed that wavelength conversion efficiency at the stage of manufacture completion is very lower than wavelength conversion efficiency expected based on the inherent characteristic of the nano materials.

One of the causes seems to lie in that the wavelength conversion portion is thin. A micro display for a glasses-like device requires a pixel size of 10 μm or smaller, and sub-pixels of 5 μm or smaller size, which constitute a pixel and emit red light, green light, blue light, and other light colors. The wavelength conversion portion for achieving such a micro display has a thickness of 5 μm or smaller. This is approximately one-tenth or smaller of the thickness of a quantum-dot-containing film that is used for the backlight module of a liquid crystal display and to which Japanese Unexamined Patent Application Publication No. 2016-103461 is directed. A thick wavelength conversion portion, like a quantum-dot-containing film for a backlight, does not considerably degrade the property if more or less deteriorating on the surface, but not deteriorating inside. Let the quantum-dot-containing film for the backlight be 50 μm thick for instance, accordingly, the entire conversion efficiency stands at 90% or greater of that in a case without deterioration even if the conversion efficiency of 5 μm on its surface stands at 0%.

Furthermore, different sub-pixels emit different colors of light in a micro display, and hence, a wavelength conversion portion needs to be formed that contains different nano materials for different sub-pixels. For instance, when a green-light-emitting quantum dot layer is formed in a green sub-pixel after a red-light-emitting quantum dot layer is formed in a red sub-pixel, the red-light-emitting quantum dot layer formed once becomes under the influence of a step of forming the green-light-emitting quantum dot layer. In this way, that the wavelength conversion portion is formed through a long process step also seems to be a cause of deterioration advance.

For the wavelength conversion portion of a micro display for a glasses-like device, the deterioration of a quantum dot layer during a process step of manufacturing the wavelength conversion portion needs to be reduced; nevertheless, when such deterioration is inevitable, a technique for recovering the deterioration is required.

SUMMARY OF THE INVENTION

One aspect of the present invention has been made in view of this problem and aims to recover the deterioration of a nano material that occurs during a manufacturing process step and to enhance wavelength conversion efficiency, thereby reducing the power consumption of a micro light-emitting element having a wavelength conversion portion, and the power consumption of an image display element including such a micro light-emitting element.

To solve the above problem, a micro light-emitting element according to one aspect of the present invention is a micro light-emitting element including the following: a micro LED element configured to emit excitation light; and a wavelength conversion portion containing a nano particle configured to absorb the excitation light to emit light having a longer wavelength than the excitation light, wherein the wavelength conversion portion has, on at least a light emitting surface of the wavelength conversion portion, a stack of one or more layers including an oxygen absorption film.

To solve the above problem, a micro light-emitting element according to one aspect of the present invention is a micro light-emitting element including the following: a micro LED element configured to emit excitation light; and a wavelength conversion portion containing a nano particle configured to absorb the excitation light to emit light having a longer wavelength than the excitation light, wherein the wavelength conversion portion has, on at least a light emitting surface of the wavelength conversion portion, a stack of one or more layers including an inorganic oxide thin film, and the inorganic oxide thin film is configured to increase, over time, conversion efficiency at which the nano particle converts the excitation light into the light having a longer wavelength than the excitation light.

An image display element according to one aspect of the present invention is an image display element including the following: micro light-emitting elements disposed in array; and a driving circuit substrate including a driving circuit configured to supply a current to the micro light-emitting elements to cause the micro light-emitting elements to emit light, wherein each of the micro light-emitting elements includes an excitation-light-emitting element configured to emit excitation light, and a wavelength conversion portion configured to absorb the excitation light to emit light having a longer wavelength than the excitation light, the excitation-light-emitting element and the wavelength conversion portion are stacked in this order on the driving circuit substrate, and the micro light-emitting element emits the light having a longer wavelength than the excitation light in an upward direction that is opposite to where the driving circuit substrate is located, a partition wall is disposed on the side surface of the wavelength conversion portion, and an oxygen absorption film is disposed on at least a light emitting surface of the wavelength conversion portion.

The aspects of the present invention can reduce the power consumption of the micro light-emitting element and of the image display element by improving the conversion efficiency of the wavelength conversion portion.

BRIEF DESCRIPTION OF THE DRAWINGS

FIG. 1 is a schematic sectional view of an image display element according to a first preferred embodiment of the present invention;

FIG. 10 is a schematic sectional view of an image display element according to a second preferred embodiment of the present invention;

FIG. 11 is a schematic sectional view of an image display element according to a third preferred embodiment of the present invention;

FIG. 13 is a schematic sectional view of an image display element according to a fifth preferred embodiment of the present invention;

FIG. 14 is a schematic top plan view of a wavelength conversion portion of the image display element according to the fifth preferred embodiment of the present invention; and FIG. 15 is a schematic sectional view of an image display element according to a sixth preferred embodiment of the present invention.

DETAILED DESCRIPTION OF THE INVENTION

Figure 2:
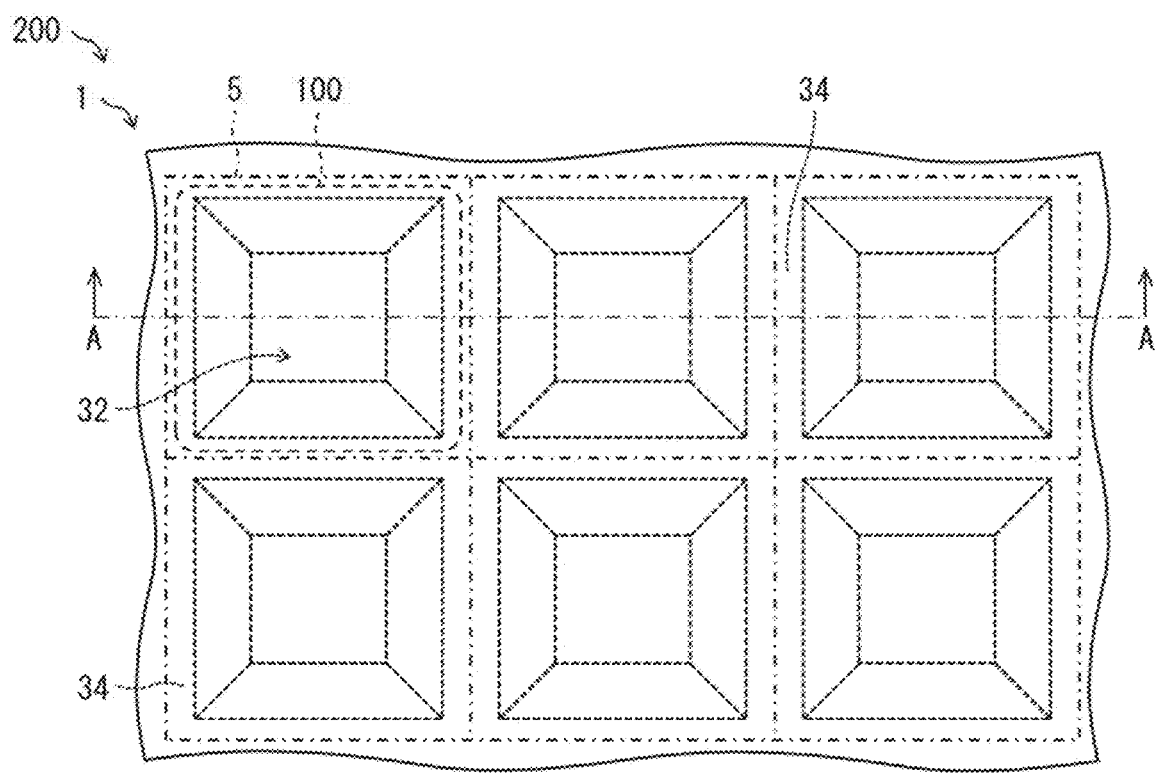
FIG. 2 is a schematic top plan view of a wavelength conversion portion of the image display element according to the first preferred embodiment of the present invention.

The following describes preferred embodiments of the present invention with reference to FIG. 1 through FIG. 15 while taking an image display element having a plurality of micro light-emitting elements for example. It is noted that the image display element includes a plurality of micro light-emitting elements and a driving circuit substrate, and that the driving circuit substrate supplies a current to the micro light-emitting elements, located in a pixel region, and controls light emission. The micro light-emitting elements are disposed in array in the pixel region. The micro light-emitting elements emit light opposite the driving circuit substrate. Unless otherwise specified, a surface from which the micro light-emitting elements emit light into the air is referred to as a light emitting surface. It is noted that in the description of the configuration of the image display element, unless otherwise specified, the light emitting surface is referred to as an upper surface (first surface); a surface opposite to the light emitting surface, as a lower surface (second surface), and a lateral surface excluding the upper surface and lower surface, as a side surface. A direction perpendicular to the light emitting surface and going toward the air is referred to as "forward". The surface of the driving circuit substrate is a bonding surface, bonding to the plurality of micro light-emitting elements, and is provided with the plurality of micro light-emitting elements attaching thereto. Unless otherwise specified, a horizontal surface refers to a surface parallel to the bonding surface.

The driving circuit substrate includes, in the pixel region, a micro-light-emitting-element driving circuit that controls a current that is supplied to each micro light-emitting element, and the driving circuit substrate includes, outside the pixel region, a row selection circuit that selects rows of the micro light-emitting elements, arranged in two-dimensional matrix, a column-signal output circuit that outputs a light emission signal to each column, an image processing circuit that calculates a light emission signal on the basis of an input signal, an input-and-output circuit, and other components. The driving circuit substrate has, on its bonding surface, N-drive electrodes (first drive electrodes) and P-drive electrodes (second drive electrodes) both connected to the micro light-emitting elements. The driving circuit substrate, which is typically a silicon substrate (semiconductor substrate) provided with LSIs (integrated circuits), or a glass substrate or plastic substrate provided with thin-film transistors (TFTs), can be manufactured with a publicly known technique; thus, the function and configuration of the driving circuit substrate will not be detailed.

Although the Specification describes only a structure where a P-electrode is directly connected to a P-drive electrode, both may be connected together with a member, such as a bump, a paste or a nano particle, interposed therebetween.

Although the following describes an excitation-light-emitting element composed mainly of a nitride semiconductor, a material constituting a light emission layer is not limited to a nitride semiconductor; other semiconductor compound materials, including a perovskite material and a quantum dot material, may be used. With regard to a nitride semiconductor layer, although the following describes a configuration where a P-side layer is disposed on the driving circuit substrate, the P-side layer can be disposed on the light emitting surface. An N-side layer, the light emission layer, and the P-side layer are each normally not a monolayer, but are composed of a plurality of layers and optimized; the detailed structure of the N-side layer, light emission layer and P-side layer, which is not directly relevant to one aspect of the present invention, will not be described. Although the light emission layer is normally interposed between an N-type layer and a P-type layer, the N-type layer and the P-type layer can include, in some cases, a non-doped layer, or a layer having a dopant the conductivity of which is inverted. Accordingly, the N-type layer and the P-type layer will be respectively described as an N-side layer and a P-side layer.

It is noted that although the drawings illustrate a micro light-emitting element in a nearly square shape, the micro light-emitting element may have any shape. The micro light-emitting element can have various planar shapes, including a triangle, a rectangle, a polygon, a circle and an ellipse; the largest length is assumed to be 60 μm or smaller. The image display element is assumed to include 3000 or more micro light-emitting elements integrated in a pixel region 1.

First Preferred Embodiment

Configuration of Image Display Element 200

Figure 3:
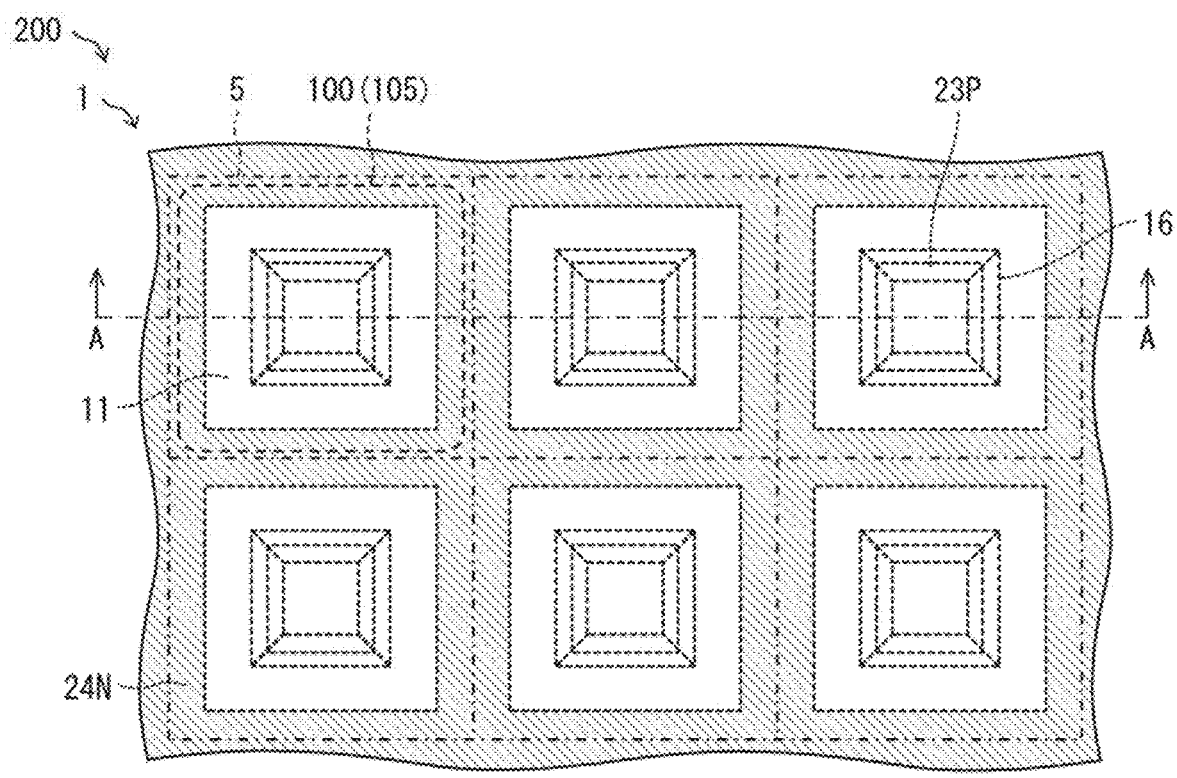
FIG. 3 is a schematic top plan view of an excitation-light-emitting element of the image display element according to the first preferred embodiment of the present invention.
Figure 4:
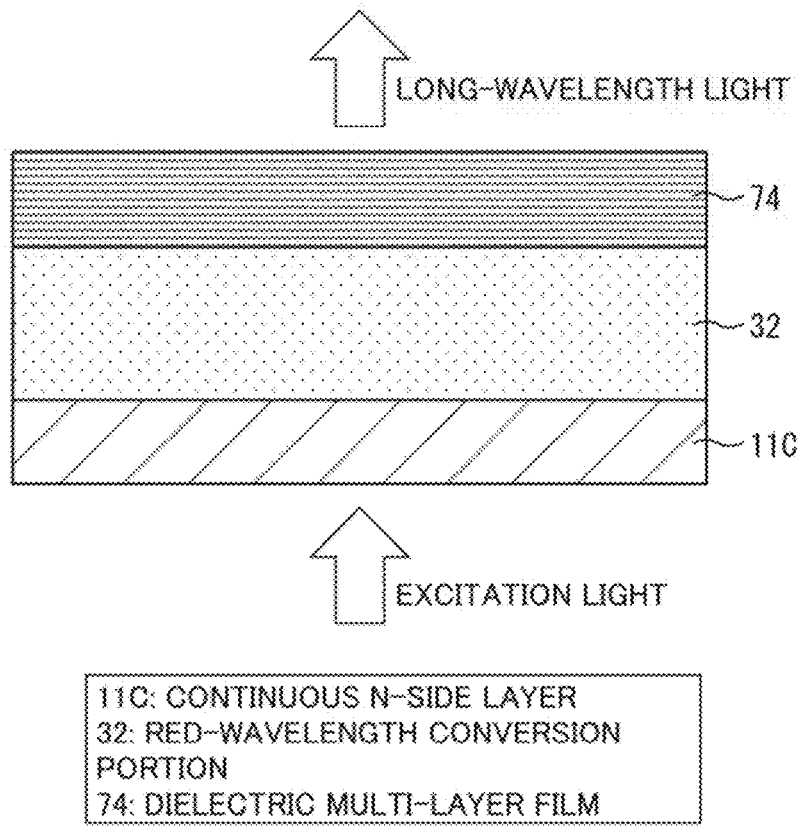
FIG. 4 is an enlarged sectional view near the upper surface of the wavelength conversion portion of the image display element according to the first preferred embodiment of the present invention.

FIG. 1 is a schematic sectional view of the pixel region 1 of an image display element 200 according to a first preferred embodiment of the present invention. FIG. 2 is a schematic top plan view of a red-wavelength conversion portion 32 in the pixel region 1 of the image display element 200 according to the first preferred embodiment of the present invention. FIG. 3 is a schematic top plan view of an excitation-light-emitting element 105 in the pixel region 1 of the image display element 200 according to the first preferred embodiment of the present invention. FIG. 1 is a sectional view taken along line A-A in FIG. 2 and FIG. 3.

The image display element 200 has a plurality of pixels 5 arranged in array in a top view of the pixel region 1, as illustrated in FIG. 2. In this preferred embodiment, the image display element 200 is a single-color display element, and each pixel 5 includes one micro light-emitting element 100 of a single color. Each pixel 5 in the image display element 200 emits red light, and the image display element 200 displays a single-color image of red by regulating the intensity of the individual light.

The micro light-emitting element 100 is composed of an excitation-light-emitting element 105 (micro LED element, which is a light emitting diode) that emits blue light, the red-wavelength conversion portion 32, and a partition wall 34. The excitation-light-emitting element 105 includes a nitride semiconductor layer 14, an N-electrode 24N (first electrode), and a P-electrode 23P (second electrode). The nitride semiconductor layer 14 has a stack of, from near the light emitting surface, an N-side layer 11, a light emission layer 12 and a P-side layer 13, and part of the P-side layer 13 through N-side layer 11 is separated from the other light-emitting elements as mesas 16. The perimeter of the mesas 16 is covered with a protective film 17. A continuous N-side layer 11C, which is a layer above the N-side layer 11, continues between adjacent pixels and constitutes part of an N-electrode wire. The N-electrode 24N is disposed on the lower surface of the continuous N-side layer 11C remaining between the mesas 16. The N-electrode 24N may be disposed in a meshed manner, as illustrated in FIG. 3.

The P-electrode 23P is connected to the P-side layer 13 and is connected to a P-drive electrode 52 on the driving circuit substrate 50. The N-electrode 24N is connected to an N-drive electrode (not shown) outside the pixel region 1. The amount of light emission from the excitation-light-emitting element 105 is controlled in accordance with the amount of current that is fed between the N-drive electrode and P-drive electrode 52 of the driving circuit substrate 50. The excitation-light-emitting element 105 and the red-wavelength conversion portion 32 are stacked in this order on the driving circuit substrate 50.

The space between the excitation-light-emitting element 105 and the driving circuit substrate 50 is filled with a filler 60. The filler 60 may be a resin under-filler, or an inorganic film such as a $SiO_2$ film. The filler 60 may be transparent, but preferably has the capability of blocking light.

The red-wavelength conversion portion 32 and the partition wall 34 are disposed over the excitation-light-emitting element 105, as illustrated in FIG. 1. The partition wall 34 is disposed at the boundary between the adjacent pixels 5 and on the side surface of the red-wavelength conversion portion 32. The partition wall 34 in this configuration is composed of a metal film having an inclined side surface. The partition wall 34 preferably has high-reflectivity side walls and preferably contains aluminum or silver as a main constituent. The partition wall 34 has side surfaces inclined to open toward a light exit direction. The angle between the side walls and the horizontal plane is specified as an inclination angle θw. The inclination angle θw is preferably small as much as possible.

The red-wavelength conversion portion 32 is composed of a resin material containing nano particles (quantum dots) that absorb excitation light emitted from the excitation-light-emitting element 105, to emit longer-wavelength light, which has a longer wavelength than the excitation light, in an upward direction that is opposite to where the driving circuit substrate 50 is located. Hereinafter, a nano particle that is contained in a wavelength conversion portion and that absorbs excitation light to emit long-wavelength light having a longer wavelength than the excitation light will be referred to as a wavelength-conversion nano particle. The red-wavelength conversion portion 32 may contain scatterer particles that do not absorb excitation light and do not convert a wavelength. Although the red-wavelength conversion portion 32 is preferably as high as the partition wall 34, the red-wavelength conversion portion 32 may be higher, as illustrated in FIG. 1. Rendering the red-wavelength conversion portion 32 higher than the partition wall 34 flattens the surface, thus facilitating thin film formation onto the red-wavelength conversion portion 32. A transparent resin layer may be formed on the upper surfaces of the red-wavelength conversion portion 32 and partition wall 34 in order to flatten the surface when there are asperities on the upper surface of the red-wavelength conversion portion 32 and the upper surface of the partition wall 34.

Such a structure as that in FIG. 1 is formed by attaching the excitation-light-emitting element 105 onto the driving circuit substrate 50, followed by forming the partition wall 34, followed by forming the red-wavelength conversion portion 32, followed by a dielectric multi-layer film 74. Asperities on the partition wall 34 reduce the thickness uniformity in the red-wavelength conversion portion 32, possibly causing a crack in the dielectric multi-layer film 74. To avoid such a problem, it is desirable to extend the partition wall 34 to the outside of the pixel region 1 and to form a slope at its end. Forming a resin pattern with thermal flowability at the end, followed by heating can form a smooth slope for instance.

A stack of one or more layers including an oxygen absorption film (a stack of one or more layers including an inorganic oxide thin film) is formed on the red-wavelength conversion portion 32 (the light emitting surface of the red-wavelength conversion portion 32). In this preferred embodiment, the dielectric multi-layer film 74 (an oxygen absorption film, an inorganic oxide thin film) is formed on the red-wavelength conversion portion 32. The dielectric multi-layer film 74 continuously covers the entire light emitting surface of the red-wavelength conversion portion 32. The dielectric multi-layer film 74 reflects blue light (excitation light) emitted by the excitation-light-emitting element 105 and has the capability of passing red light (long-wavelength light), and the dielectric multi-layer film 74 can reduce blue-light emission and increase the amount of red-light emission.

The dielectric multi-layer film 74 has a stack of 10 titanium oxide ($TiO_x$) films and 11 silicon oxide ($SiO_y$) films and is 1.3 µm thick as a whole. Here, x and y are numbers greater than zero and smaller than two. Further, a niobium oxide ($Nb_2O_m$) film, a tantalum oxide ($Ta_2O_n$) film, and other films may be used instead of a $TiO_x$ film; the material of the dielectric multi-layer film 74 is not limited to a combination of $TiO_x$ and $SiO_y$ films. Here, m and n are numbers greater than zero and smaller than three. The dielectric multi-layer film 74, although formed through sputtering in this configuration, may be formed through evaporation.

TABLE 1

|  | A | B | C |
|---|---|---|---|
| Post-Sample-Production | 5,910 | 4,201 | 2,009 |
| 3 Months Later | 7,148 | 4,928 | 2,485 |
| Ratio | 121% | 117% | 124% |

In the foregoing structure, samples A, B, and C were formed, and a comparison about red light (long-wavelength light) luminance was made between these samples immediately after the formation of the dielectric multi-layer film 74 and these samples left to stand for three months, to thus find conspicuous increases, as shown in Table 1. The comparison has revealed that leaving the red-wavelength conversion portion 32 stand improves the conversion efficiency of the red-wavelength conversion portion 32. It is noted that samples A, B, and C contain different quantum dot materials as their wavelength-conversion nano particles, and that such improvement seems to be not a phenomenon that is inherent to a particular quantum dot material. Such increase was not found, and a tendency of decrease was found in a structure having no dielectric multi-layer film 74, that is, a structure where the red-wavelength conversion portion 32 contacts the air directly, or in a structure where a transparent resin layer is formed on the red-wavelength conversion portion 32. The fact that the conversion efficiency of the red-wavelength conversion portion 32 improves has led to a conclusion that the dielectric multi-layer film 74 does not merely function as a barrier film that avoids oxygen intrusion and moisture intrusion from outside.

Accordingly, a similar experiment was conducted, where the dielectric multi-layer film 74 was formed by changing the amount of oxygen that was to be added into reactive gas. The experiment has revealed that a smaller amount of added oxygen equals a greater degree of improvement in the conversion efficiency of samples left to stand. This result leads to an estimates that the layers constituting the dielectric multi-layer film 74 turn from stoichiometric composition into an oxygen deficiency state, thus absorbing oxygen contained in the red-wavelength conversion portion 32 and prevent non-light-emission rejoining of quantum dots (wavelength-conversion nano particles), thus improving the conversion efficiency.

It is known that the conversion efficiency of the quantum dot materials (wavelength-conversion nano particle materials) contained in the red-wavelength conversion portion 32 reduces if the quantum dot materials are left to stand in the air, and oxygen seems to be a cause of such reduction. However, since the conversion efficiency of the quantum dots (wavelength-conversion nano particles) recovers, it is estimated that unlike oxidation by oxygen, an irreversible chemical reaction is not occurring. The conversion efficiency of the red-wavelength conversion portion 32 reduces when the red-wavelength conversion portion 32 comes into contact with oxygen during a manufacturing process step, but eliminating oxygen seems to possibly recover the conversion efficiency. It is noted that the quantum dot materials (wavelength-conversion-portion nano particle materials) used in this study are materials each containing an indium-phosphorus (InP) core covered with a shell mainly made of zinc sulfide (ZnS). The core typically has a diameter of about 1 to 10 nm, which is selected appropriately in accordance with the wavelength of emitted light. Other core-shell quantum dots can be used as the wavelength-conversion nano particles. For instance, such core materials may be cadmium sulphide selenide ($CdS_xSe_{1-x}$), cadmium tellurium (CdTe), or lead sulfide (PbS). Such shell materials may be zinc selenide (ZnSe) or other things. Further, the wavelength-conversion nano particles are not limited to core-shell quantum dots; other materials may be used as nano materials that emit light. For instance, perovskite nano crystals ($CsPbX_3$, where X is Cl, Br or I) or other things may be used.

Figure 5:
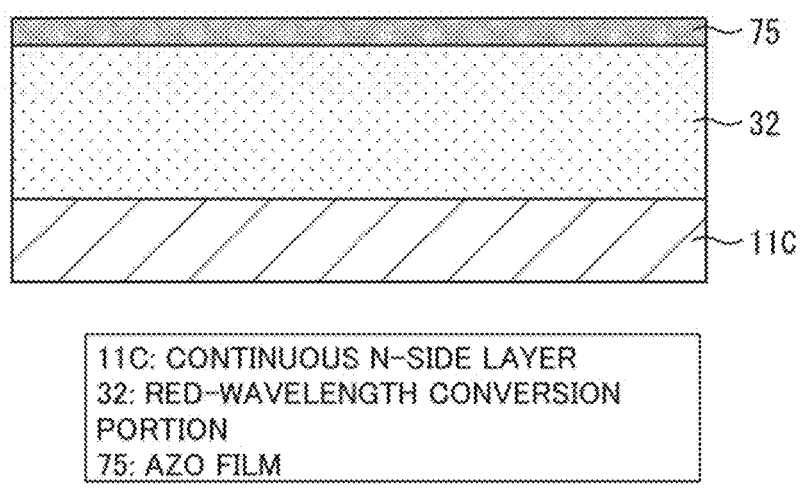
FIG. 5 is an enlarged sectional view near the upper surface of the wavelength conversion portion of the image display element according to the first preferred embodiment of the present invention and illustrates another example of an oxygen absorption film.

When the foregoing estimation is correct, an oxidized film layer other than the dielectric multi-layer film 74 is supposed to achieve a similar effect. Accordingly, a similar experiment was conducted, where a structure with an aluminum-doped zinc oxide (AZO) film 75 disposed on the red-wavelength conversion portion 32 was produced, as illustrated in FIG. 5 instead of FIG. 4, which is an enlarged view of the red-wavelength conversion portion 32 in FIG. 1. The AZO film was formed through sputtering, like the dielectric multi-layer film 74, and the amount of oxygen that was to be added to argon (Ar) gas for sputtering was smaller than usual by one-third. The AZO film 75 used in this experiment was 220 nm thick; no clear diffraction peak was found in the result of an X-ray diffraction analysis, and the AZO film 75 seemed to be in an amorphous state. A comparison was made between red band luminance immediately after the formation of the AZO film 75 and red band luminance three months later from the formation, to find a 29% increase. An equal or more effect was achieved in spite of the fact that the AZO film 75 was thinner than the dielectric multi-layer film 74.

Figure 6:
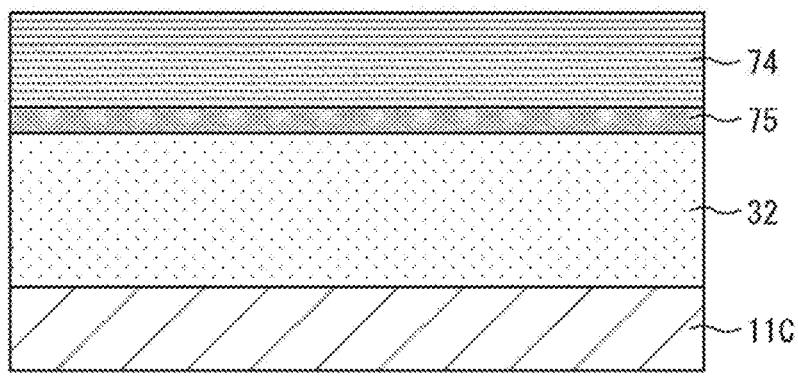
FIG. 6 is an enlarged sectional view near the upper surface of the wavelength conversion portion of the image display element according to the first preferred embodiment of the present invention and illustrates further another example of the oxygen absorption film.
Figure 7:
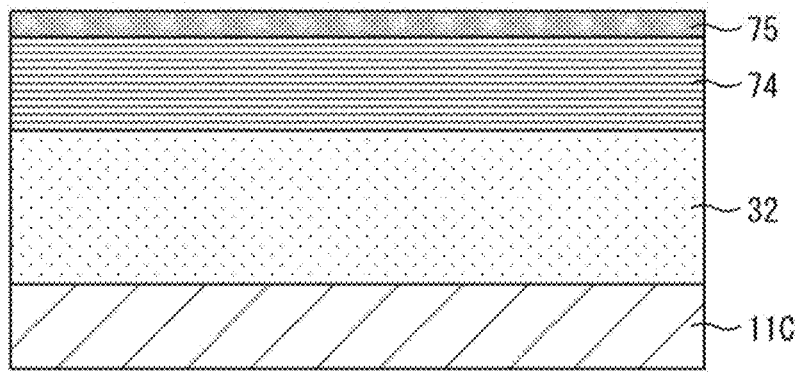
FIG. 7 is an enlarged sectional view near the upper surface of the wavelength conversion portion of the image display element according to the first preferred embodiment of the present invention and illustrates further another example of the oxygen absorption film.

Another comparison was made between an instance where the AZO film 75 and the dielectric multi-layer film 74 were stacked onto the red-wavelength conversion portion 32 in this order, as illustrated in FIG. 6, and an instance where the AZO film 75 and the dielectric multi-layer film 74 were stacked onto the red-wavelength conversion portion 32 in order opposite to the order of the layers of the stack in FIG. 6. In other words, FIG. 6 illustrates an instance where the AZO film 75 is in contact with the red-wavelength conversion portion 32 (that is, the AZO film 75 is adjacent to the red-wavelength conversion portion 32), and where the dielectric multi-layer film 74 is disposed the AZO film 75, and FIG. 7 illustrates an instance where the dielectric multi-layer film 74 is in contact with the red-wavelength conversion portion 32 (that is, the dielectric multi-layer film 74 is adjacent to the red-wavelength conversion portion 32), and where the AZO film 75 is disposed on the dielectric multi-layer film 74. The ratios of conversion efficiency improvement were 47% and 56%. It estimates that overlapping the AZO film 75 and the dielectric multi-layer film 74 together offers a great improvement range, and that the capability of oxygen absorption in both instances has been added.

Figure 8:
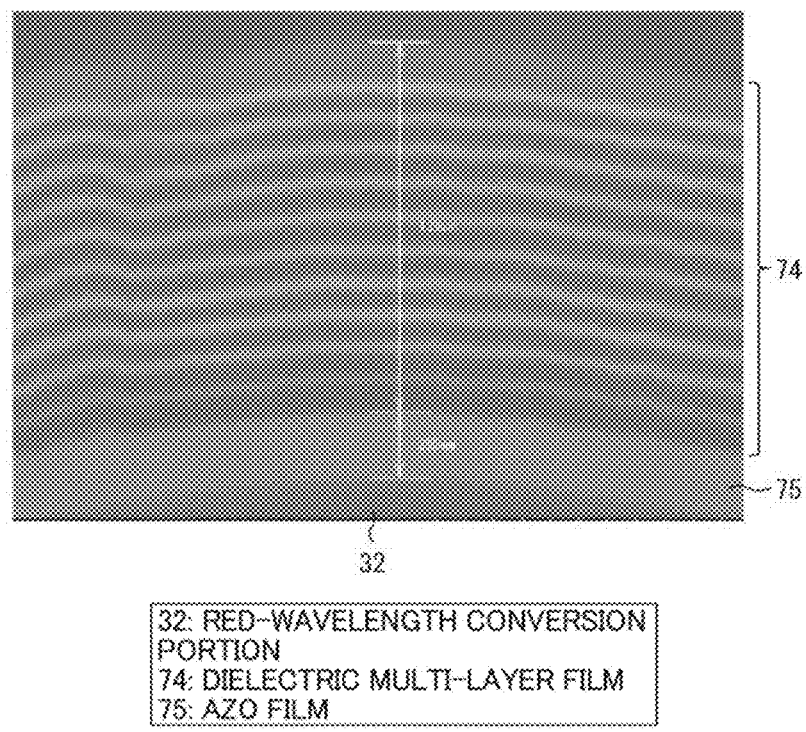
FIG. 8 is a sectional STEM photograph near the upper surface of the wavelength conversion portion of the image display element according to the first preferred embodiment of the present invention.

FIG. 8 is a STEM image (i.e., an image captured by a scanning transmission electron microscope) of portions of the AZO film 75 and dielectric multi-layer film 74 in the structure in FIG. 6. The AZO film 75 is an amorphous film and thus has no such columnar structure and particulate structure as those often found in multi-crystal films. The dielectric multi-layer film 74 likewise has no grain boundary or other things and seems to be of amorphous structure. It is known that there are typically many dangling bonds in an amorphous state; thus, oxygen deficiency easily occurs in oxides. It is noted that an oxide film does not have to be entirely in an amorphous state; fine crystal grains and an amorphous phase may be mixed together.

Figure 9:
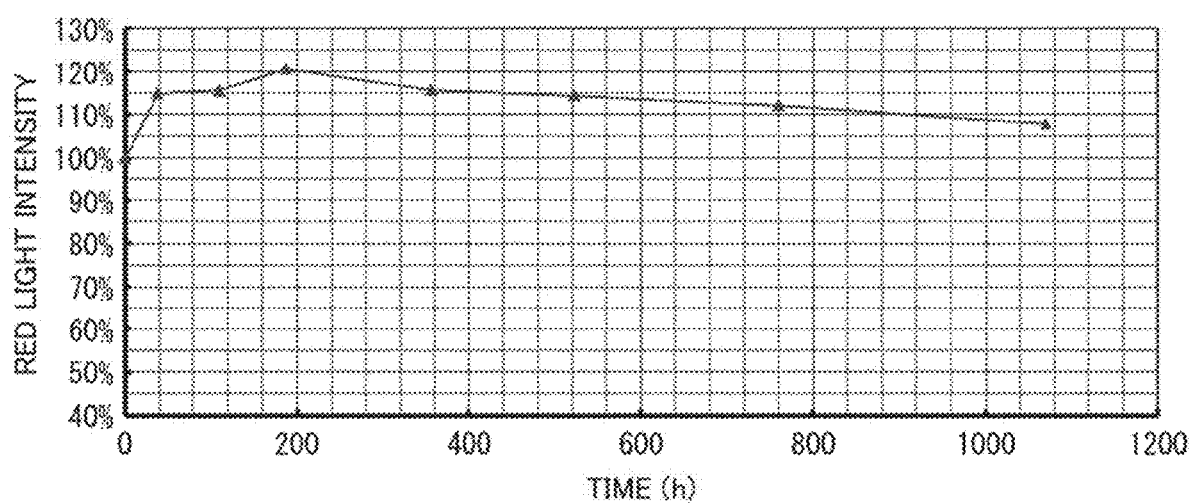
FIG. 9 is a graph showing changes over time in red sunlight intensity under blue-light irradiation in the image display element according to the first preferred embodiment of the present invention.

Such property improvements in the wavelength conversion portion are found not only in a wavelength-conversion nano particle that performs red light conversion, but also in a wavelength-conversion nano particle that performs green light conversion, which are similar to the instance in red light and will not be thus repeated. The foregoing samples were kept in a dark place, but their conversion efficiency improved even under light irradiation. FIG. 9 illustrates over-time changes in red light intensity under blue-light irradiation with regard to the red-wavelength conversion portion 32 having the AZO film 75 and dielectric multi-layer film 74 illustrated in FIG. 8. The intensity increases by 20% 200 hours later when compared to that immediately after (time 0 h) the formation of the AZO film 75 and dielectric multi-layer film 74. As such, this phenomenon seems to be a useful structure in actual use as a display element. Gentle deterioration occurs due to light irradiation on or after 200 hours, but this phenomenon is found also in a structure having no AZO film 75 and no dielectric multi-layer film 74.

As described above, placing, in the light exit direction in a wavelength conversion portion, a thin film composed of an oxygen absorption film can improve (increase), over time, the light conversion efficiency of the wavelength-conversion nano particles within the wavelength conversion portion. Further, improving the conversion efficiency of the wavelength conversion portion can reduce the power consumption of the micro light-emitting element 100 or image display element 200. This enables a color-display element with high efficiency and with low power consumption to be easily achieved. Furthermore, enhancing wavelength conversion efficiency can increase the efficiency of light emission and thus can achieve a wide color gamut and a high color rendering property.

The oxygen absorption film is not limited to the foregoing particular inorganic oxide; the oxygen absorption film may be composed of an inorganic oxide with its composition shifted in an oxygen deficiency direction from stoichiometric composition (stoichiometric state). Alternatively, the oxygen absorption film may be an inorganic oxide film including an amorphous state. Placing the oxygen absorption film continuously onto the entire surface of the wavelength conversion portion in the light exit direction can improve the conversion efficiency of the wavelength conversion portion and can provide a micro light-emitting element with high efficiency an image display element with high efficiency.

Second Preferred Embodiment

Another preferred embodiment of the present invention will be described with reference to FIG. 10. It is noted that for convenience in description, components having the same functions as those described in the foregoing preferred embodiment will be denoted by the same signs, and that the description of these components will not be repeated. An image display element 200a according to the second preferred embodiment is different from the one according to the first preferred embodiment in the configuration of an oxygen absorption film. The other components are similar to those according to the first preferred embodiment. The following describes the difference between the first and second preferred embodiments.

In this configuration, a second AZO film 77 (a second oxygen absorption film, a third oxygen absorption film, a second inorganic oxide thin film, a third inorganic oxide thin film) is provided on the surface of the continuous N-side layer 11C and the surface of the partition wall 34. That is, an oxygen absorption film, which is herein an AZO film, is disposed also on the lower surface and side surface of the red-wavelength conversion portion 32 to thus cover the entire perimeter of the red-wavelength conversion portion 32. The conversion efficiency seems to improve more greatly along with increase in surface for placing the oxygen absorption film. This can further strengthen the recovery of the conversion efficiency of the red-wavelength conversion portion 32. Such a structure requires an additional process steps, but does not incur a large cost increase, because the second AZO film 77 is stacked before the red-wavelength conversion portion 32 is formed.

Furthermore, a dielectric multi-layer film 74a, which is an oxygen absorption film, is divided for each pixel 5 (for each red-wavelength conversion portion 32) in this configuration. The ends of the divided dielectric multi-layer films 74a are on the upper surface of the partition wall 34. Dividing the dielectric multi-layer film for each pixel 5, although increasing process steps and being thus negative in cost, is required in some cases in order to avoid an optical crosstalk that occurs via the dielectric multi-layer films 74a. However, it is difficult in some cases to place the ends of the dielectric multi-layer films 74a onto the upper surface of the partition wall 34 without fail when the pixels 5 are increasingly miniaturized. Variations in manufacturing accuracy can cause the ends of the dielectric multi-layer films 74a to deviate from the upper surface of the partition wall 34, and thus, part of the upper surface of the red-wavelength conversion portion 32 is not possibly covered with the dielectric multi-layer films 74a. Even in such a case, the red-wavelength conversion portion 32 in this configuration, which includes the second AZO film 77 disposed on the lower surface and the side surface, can achieve the recovery of the conversion efficiency.

It is noted that the present preferred embodiment is also applicable to a configuration where the oxygen absorption film is a film other than the dielectric multi-layer film 74a. Such an AZO film and such a combination of an AZO film and dielectric multi-layer film as described in the first preferred embodiment, or other oxygen absorption films may be used. Alternatively, only a main layer that causes an optical crosstalk may be divided between the pixels 5, like an instance where a thin AZO film is not divided between the pixels 5, and only the thick dielectric multi-layer film 74a is divided between the pixels 5. The second AZO film 77 can be replaced with other oxygen absorption films.

This configuration can achieve an effect similar to that in the first preferred embodiment.

Third Preferred Embodiment

Another preferred embodiment of the present invention will be described with reference to FIG. 11. It is noted that for convenience in description, components having the same functions as those described in the foregoing preferred embodiments will be denoted by the same signs, and that the description of these components will not be repeated. An image display element 200b according to the third preferred embodiment is different from the one according to the first preferred embodiment in the configuration of an oxygen absorption film. The other components are similar to those according to the first preferred embodiment. The following describes the difference between the first and third preferred embodiments.

In this configuration, a nano particle film 76 is used as an oxygen absorption film. A nano particle film is a thin film composed of an aggregation of particles having an average diameter of several nanometers (nm) to several hundred nanometers. Suitable examples of a material that constitutes these nano particles of the nano particle film 76 include inorganic substances, such as a single-element oxide being transparent and having stable properties, including $SiO_2$, $TiO_2$, $Nb_2O_3$, and $Al_2O_3$, a multi-element oxide containing a plurality of these elements, a nitride such as $Si_3N_4$, an oxide nitride, including SiON, and a nitride carbide, including SiCN. The nano particle film 76 can be formed onto a thin film by dispersing nano particles into a solvent or resin, followed by application onto the red-wavelength conversion portion 32. The nano particles may be bonded together with transparent resin.

In FIG. 11, the red-wavelength conversion portion 32 has a surface height lower than the height of the partition wall 34. The nano particle film 76 fills the level difference between the red-wavelength conversion portion 32 and the partition wall 34. The nano particle film 76, which has many spaces between its nano particles, cannot stop the diffusion of outside air, thus allowing oxygen to penetrate the red-wavelength conversion portion 32, thus degrading the conversion efficiency of the red-wavelength conversion portion 32 over time; to avoid this degradation, the closely packed AZO film 75 is disposed on the nano particle film 76. Such a structure enables the AZO film 75 to block the penetration of oxygen within the air into the red-wavelength conversion portion 32. The nano particle film 76 has many nano-particle surfaces and can adsorb oxygen on these nano-particle surfaces.

Like this configuration, the nano particle film 76, an aggregation of nano particles containing many nano particle surfaces, functions as an oxygen absorption film and can achieve an effect similar to that in the first preferred embodiment.

Fourth Preferred Embodiment

Another preferred embodiment of the present invention will be described with reference to FIG. 12. It is noted that for convenience in description, components having the same functions as those described in the foregoing preferred embodiments will be denoted by the same signs, and that the description of these components will not be repeated. An image display element 200c according to the fourth preferred embodiment is different from the one according to the first preferred embodiment in the configuration of an excitation-light-emitting element and of a partition wall. The other components are similar to those according to the first preferred embodiment.

The following describes the red-wavelength conversion portion 32, which holds true for other wavelengths. The dielectric multi-layer film 74, although continuously disposed over pixels 5c in FIG. 12, may be divided for each pixel 5c, like that according to the second preferred embodiment.

Figure 12:
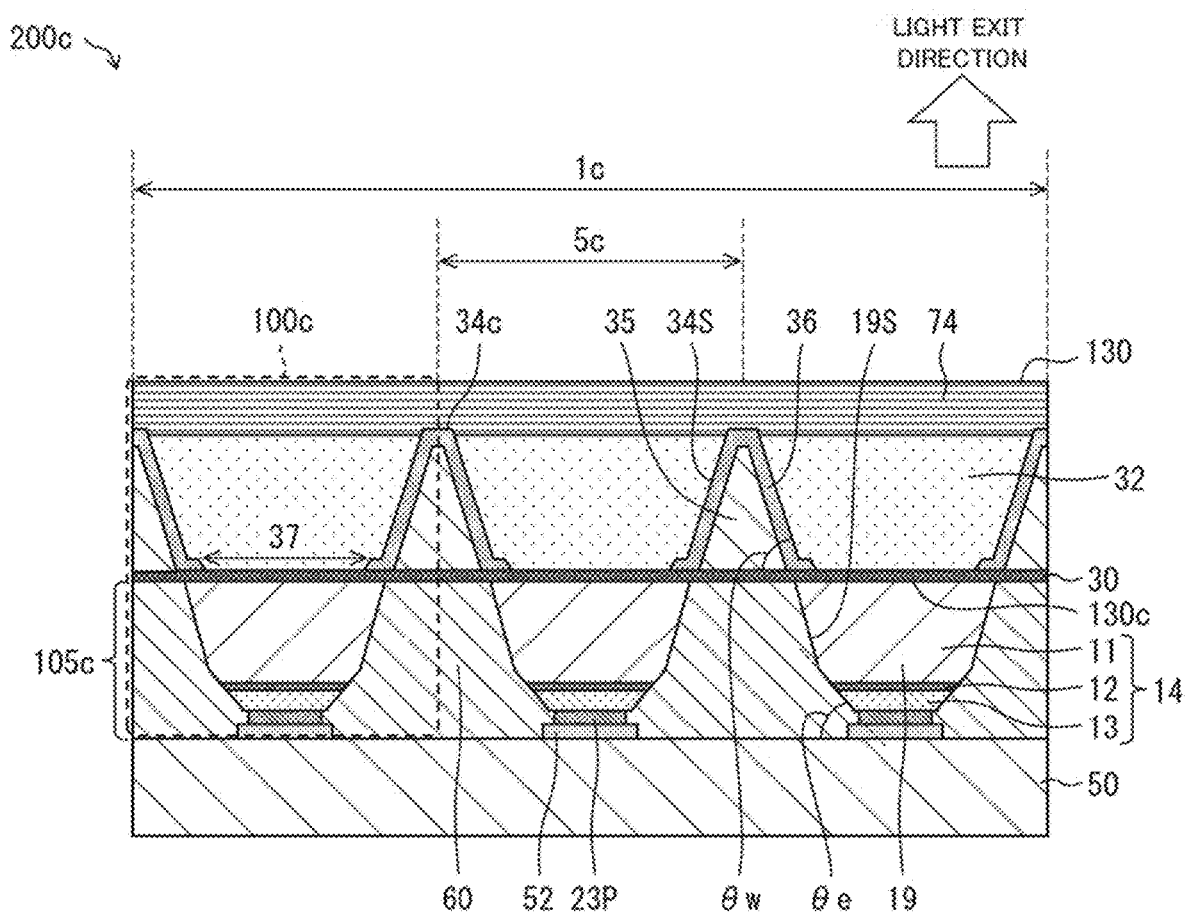
FIG. 12 is a schematic sectional view of an image display element according to a fourth preferred embodiment of the present invention.

The configuration in FIG. 12 of this preferred embodiment has an excitation-light-emitting element 105c divided individually for each pixel 5c. That is, bodies 19, each composed of the nitride semiconductor layer 14 constituting the excitation-light-emitting element 105c, are separated from each other and thus have no such continuous portion as the continuous N-side layer 11C according to the first preferred embodiment. Such a structure is required in some cases in order to avoid an optical crosstalk that is caused by blue-light leakage to an adjacent pixel. In such a configuration, a transparent electrode 30 (a second oxygen absorption film, a second inorganic oxide thin film) is required instead of the continuous N-side layer 11C according to the first preferred embodiment. The transparent electrode 30 in this configuration is composed of an AZO film. A conductive AZO film can function as an oxygen absorption film while used as the transparent electrode 30. That is, the red-wavelength conversion portion 32 in this configuration has the dielectric multi-layer film 74 disposed on its red-light emitting surface and has the AZO film disposed on its surface (lower surface) adjacent to the excitation-light-emitting element 105c. It is noted that the transparent electrode 30 is not limited to a monolayer film; the transparent electrode 30 may have a transparent conductive layer (e.g., an ITO) disposed on a side being in contact with the N-side layer 11 and have an oxygen absorption film (e.g., an AZO) disposed on a side being in contact with the red-wavelength conversion portion 32.

It is noted that body side walls 19S (side walls) of the body 19 of the excitation-light-emitting element 105c are preferably inclined in such a manner that an inclination angle θe is equal to about 30 to 60 degrees around the light emission layer 12 and are also preferably inclined at about 85 to 70 degrees around the N-side layer 11. Such a shape of the body 19 can increase the amount of blue light that enters the red-wavelength conversion portion 32 from the excitation-light-emitting element 105c and can enhance the efficiency of blue light absorption in the red-wavelength conversion portion 32. Although not shown in FIG. 12, covering these inclined surfaces with a transparent insulating film, and covering the outside of the transparent insulating film with a high-reflectivity film of metal, such as aluminum or silver, can further improve the efficiency of blue light absorption.

Further, the partition wall 34c, partitioning the red-wavelength conversion portion 32, is not composed of such a single material as that according to the first preferred embodiment, but is composed of a partition-wall base material 35 and a partition-wall reflector 36 (optical reflector) covering the surface of the partition-wall base material 35. A surface of the partition-wall reflector 36 on the side surface of the partition wall 34c is a reflective surface and constitutes partition-wall side surfaces 34S. When the thickness of the partition-wall reflector 36 is almost constant, the inclination angle, θw, of the reflective surface is approximately equal to the inclination angle of the side surface of the partition-wall base material 35. The partition-wall base material 35 can be composed of, for instance, an inorganic material, such as $SiO_2$ or SiN, or a resin material such as a photoresist material. The partition-wall reflector 36 can be composed of, but not limited to, a high-reflectivity metal film for instance. As such, the partition wall 34c may be composed of a plurality of members when the partition-wall side surfaces 34S are favorable reflective surfaces.

In an attempt to form the partition wall 34c with a single reflector, like the first preferred embodiment, a metal film higher than the partition wall 34c needs to be stacked and to undergo photolithography and dry etching for processing into the partition wall 34c having inclined surfaces. The partition wall 34c is sometimes several micrometers high and thus requires a very thick metal film, but the surface of such a thick metal film has large asperities, thus rendering accurate alignment on a base layer difficult. Further, the bottom of each partition-wall side surface 34S does not desirably cover a light emitting surface 130c of the excitation-light-emitting element 105c; hence, the partition wall 34c needs to be aligned on the light emitting surface 130c of the excitation-light-emitting element 105c more accurately as the pixel size of the image display element 200c is smaller. Accordingly, this problem can be avoided by forming the center (partition-wall base material 35) of the partition wall 34c with a transparent material that facilitates accurate alignment and has less surface asperities, and by covering the surface thereof with the partition-wall reflector 36.

As described above, the structure illustrated in FIG. 12 is required in some cases in order to render the pixels 5c of the image display element 200c fine and to prevent an optical crosstalk.

This preferred embodiment can achieve an effect similar to that in the first preferred embodiment. In particular, placing an oxygen absorption film onto both of the upper and lower surfaces of the red-wavelength conversion portion 32 can further enhance the recovery of the conversion efficiency.

Fifth Preferred Embodiment

Another preferred embodiment of the present invention will be described with reference to FIG. 13 and FIG. 14. It is noted that for convenience in description, components having the same functions as those described in the foregoing preferred embodiments will be denoted by the same signs, and that the description of these components will not be repeated. An image display element 200d according to the fifth preferred embodiment is a full-color display element, unlike the foregoing image display elements of a single color.

FIG. 13 is a schematic sectional view of a pixel region 1d of the image display element 200d according to the fifth preferred embodiment. FIG. 14 is a schematic plan view of the pixel region 1d of the image display element 200d. FIG. 13 is a sectional view taken along line B-B in FIG. 14.

The image display element 200d has a plurality of pixels 5d arranged in array in a top view of the pixel region 1d, as illustrated in FIG. 14. Each pixel 5d includes two green sub-pixels 8 each including a single green micro light-emitting element 100G, a blue sub-pixel 6 including a single blue micro light-emitting element 100B, and a red sub-pixel 7 including a red micro light-emitting element 100R. The kind and number of sub-pixels that constitute each pixel 5d is not limited to the foregoing example. The image display element 200d includes a plurality of blue micro light-emitting elements 100B, red micro light-emitting elements 100R and green micro light-emitting elements 100G, and a driving circuit substrate 50d.

The driving circuit substrate 50d supplies a current to the blue micro light-emitting elements 100B, red micro light-emitting elements 100R and green micro light-emitting elements 100G, located in the pixel region 1d, and controls their light emission. Like the micro light-emitting element 100 according to the first preferred embodiment, each red micro light-emitting element 100R has an excitation-light-emitting element 105d that emits blue light, and a red-wavelength conversion portion 32d; moreover, each green micro light-emitting element 100G has an excitation-light-emitting element 105d that emits blue light, and a green-wavelength conversion portion 33; moreover, each blue micro light-emitting element 100B has a transparent portion 31 instead of the red-wavelength conversion portion 32d. The red-wavelength conversion portion 32d contains wavelength-conversion nano particles that absorb blue light, which is excitation light, to emit red light, and the green-wavelength conversion portion 33 contains wavelength-conversion nano particles that absorb blue light to emit green light. The transparent portion 31, which transmits blue light as is, contains no wavelength-conversion nano particles that absorb excitation light to perform wavelength conversion. The transparent portion 31, the red-wavelength conversion portion 32d, and the green-wavelength conversion portion 33 may all contain scattering particles, which scatter excitation light rather than absorb excitation light.

The excitation-light-emitting element 105d, the transparent portion 31, the red-wavelength conversion portion 32d, and the green-wavelength conversion portion 33 are together surrounded by a partition wall 34d. The partition wall 34d is disposed at the boundary between adjacent sub-pixels; in this configuration, the partition-wall reflector 36 is disposed on the surface of the partition-wall base material 35 having inclined side surfaces The partition-wall base material 35 is, for instance, a resin material composed of a resist pattern formed through photolithography and then undergone hard baking. The partition-wall reflector 36 is a high-reflective thin film of aluminum or silver. The partition-wall reflector 36 has a surface inclined to open in the light exit direction. The angle between the surface of the partition-wall reflector 36 and the horizontal plane is specified as an inclination angle θw. The inclination angle θw is preferably small as much as possible.

The excitation-light-emitting element 105d includes a body 19d, composed of the nitride semiconductor layer 14 divided, an N-electrode 23N (a first electrode), and the transparent electrode 30 (a second electrode). The transparent electrode 30 (a second oxygen absorption film, a second inorganic oxide thin film) is adjacent to a light emitting surface 130 of the nitride semiconductor layer 14, and the N-electrode 23N is adjacent to the driving circuit substrate 50d. The N-electrode 23N is connected to an N-drive electrode 51 on the driving circuit substrate 50d. The transparent electrode 30 is connected to the partition-wall reflector 36 of metal, constituting the partition wall 34d, and is connected to the P-drive electrode 52 on the driving circuit substrate 50d outside the pixel region 1d with the partition-wall reflector 36 interposed therebetween. The amount of light emission from the excitation-light-emitting element 105d is controlled in accordance with the amount of current that is fed between the N-drive electrode 51 and P-drive electrode 52 of the driving circuit substrate 50d.

The nitride semiconductor layer 14, constituting the body 19d, is composed of the N-side layer 11, the light emission layer 12 and the P-side layer 13 sequentially stacked in a location adjacent to the driving circuit substrate 50d. The light emission layer 12 is preferably disposed close to the upper surface of the nitride semiconductor layer 14. The bottom surface of the body 19d is preferably covered with the N-electrode 23N. If there is a portion not covered with the N-electrode 23N, light leaks from the body 19d toward the driving circuit substrate 50d, thus degrading the efficiency of light emission or causing an optical crosstalk.

A high-reflectivity material, such as aluminum or silver, is preferably disposed on the N-electrode 23N adjacent to the N-side layer 11. Further, aluminum and silver easily establish an Ohmic contact with the N-side layer 11 and are suitable as an electrode that is connected to the N-side layer 11. Such a configuration as that in FIG. 13, where the N-side layer 11 is disposed close to the driving circuit substrate 50d, is suitable in that a high-reflectivity metal film is easy to dispose on the lower surface of the nitride semiconductor layer 14. A configuration where the P-side layer 13 is disposed close to the driving circuit substrate 50d requires a low-reflectivity metal material such as titanium or palladium to be disposed on the lower surface of the nitride semiconductor layer 14 in order to establish an Ohmic contact between the P-side layer 13 and the driving circuit substrate 50d, and the configuration increases light absorption on the bottom surface and degrades the efficiency of light emission.

The body 19d has an upper surface provided with an opening (P-contact hole 18P) with a transparent insulating film 20 removed therefrom, and the P-side layer 13 and the transparent electrode 30 are connected together in the P-contact hole 18P. The transparent electrode 30 may be, for instance, an oxide semiconductor, such as an indium-tin-oxide (ITO), an indium-zinc-oxide (IZO), or an AZO, or may be, for instance, a silver nanofiber film or other things. Transparent electrode materials, such as an ITO, can easily establish an Ohmic contact with the P-side layer 13. The transparent electrode 30 is preferably thin as much as possible in order to reduce the absorption of excitation light. Providing an oxide semiconductor with the function of oxygen absorption enables, like that according to the fourth preferred embodiment, an oxygen absorption film to be disposed on both of the upper and lower surfaces of a wavelength conversion portion, thus further promoting the recovery of conversion efficiency. Alternatively, the transparent electrode 30 may be composed of a plurality of layers. For instance, a highly conductive ITO film may be disposed on a side being in contact with the P-side layer 13, and an AZO film may be disposed, as an oxygen absorption film, on the ITO film in contact with a wavelength conversion portion.

The entire side surface of the body 19d is covered with the transparent insulating film 20. If part of the side surface of the body 19d is covered with a metal material or a light-absorbing resin material, light extraction from the body 19d to the red-wavelength conversion portion 32d is inhibited, thus degrading the efficiency of light emission. It is preferable that the side surface of the body 19d be nearly perpendicular to the horizontal plane. Bringing the side surface nearly perpendicular can increase the area of the light emission layer 12 as much as possible and can improve resistance to processing damage.

As illustrated in FIG. 13, the excitation-light-emitting element 105d is surrounded by the partition wall 34d, the partition wall 34d is higher than the excitation-light-emitting element 105d, and the entire excitation-light-emitting element 105d except its bottom surface is covered with the transparent portion 31 and with the red-wavelength conversion portion 32d or the green-wavelength conversion portion 33. For instance, the red-wavelength conversion portion 32d over the excitation-light-emitting element 105d is preferably thick in order for the red-wavelength conversion portion 32d to efficiently absorb excitation light emitted by the excitation-light-emitting element 105d. Furthermore, the red-wavelength conversion portion 32d needs to cover the perimeter of the excitation-light-emitting element 105d. That is, filling the space between the excitation-light-emitting element 105d and the partition wall 34d with the red-wavelength conversion portion 32d enables the red-wavelength conversion portion 32d to absorb excitation light efficiently.

The plurality of blue micro light-emitting elements 100B, red micro light-emitting elements 100R and green micro light-emitting elements 100G, constituting the image display element 200d, have only the N-electrode 23N in the pixel region 1d, as illustrated in FIG. 13, and in this configuration, the N-electrode 23N can cover a wide region of a sub-pixel except the perimeter of the sup-pixel. This offers a wide region of overlap between the partition-wall reflector 36 and the N-electrode 23N in a plan view. Accordingly, the driving circuit substrate 50d no longer has an exposed region in a plan view, and light leakage to the driving circuit substrate 50d can be thus reduced.

The blue micro light-emitting element 100B having the transparent portion 31 is used in this configuration as the blue sub-pixel 6 instead of a wavelength conversion portion. This is because that radiating light into the air via the transparent portion 31 achieves higher efficiency of light emission than radiating light from the excitation-light-emitting element 105d directly into the air. The transparent portion 31 may include a first layer 31F and a second layer 31S. Rendering the refractive index of the first layer 31F lower than that of the second layer 31S can further enhance the efficiency of light emission of the blue micro light-emitting element 100B.

The red-wavelength conversion portion 32d of the red micro light-emitting element 100R may be composed of a first layer 32F and a second layer 32S, like that in the red micro light-emitting element 100R illustrated in FIG. 13. The green-wavelength conversion portion 33 of the green micro light-emitting element 100G may be composed of a first layer 33F and a second layer 33S. The refractive indexes of the first layer 32F and first layer 33F are respectively lower than the refractive indexes of the second layer 32S and second layer 33S, and the first layer 32F and the first layer 33F may be transparent resin containing no wavelength conversion material.

To form a structure like the image display element 200d, second layers need to be formed firstly in a process step of forming wavelength conversion portions and transparent portions, followed by first layers. The first layers may have the same thickness or different thicknesses between sub-pixels. When the second layers have different thicknesses between the sub-pixels, forming the first layers simultaneously can render the height of the light emitting surface 130 common between the sub-pixels. This facilitates the formation of the oxygen absorption film.

In this configuration, the oxygen absorption film includes the dielectric multi-layer film 74d, and the dielectric multi-layer film 74d has a characteristic of reflecting excitation light and transmitting long-wavelength light such as red light and green light; hence, no oxygen absorption film is disposed in the blue sub-pixel 6. However, a film having no such filtering function, when used as an oxygen absorption film, may be disposed continuously in the entire pixel region 1d.

As described above, the configuration of the image display element 200d can achieve an effect similar to that in the first preferred embodiment.

Sixth Preferred Embodiment

Another preferred embodiment of the present invention will be described with reference to FIG. 15. It is noted that for convenience in description, components having the same functions as those described in the foregoing preferred embodiments will be denoted by the same signs, and that the description of these components will not be repeated. An image display element according to this preferred embodiment is similar to the image display element 200d according to the fifth preferred embodiment, and their difference lies in that an oxygen absorption film is disposed also on the side of a wavelength conversion portion (a green micro light-emitting element 100eG, a red micro light-emitting element 100eR, a blue micro light-emitting element 100eB).

The transparent electrode 30 (a second oxygen absorption film, a third oxygen absorption film, a second inorganic oxide thin film, a third inorganic oxide thin film) in this configuration is formed to cover the surface of a partition wall 34e. Accordingly, the red-wavelength conversion portion 32d and the green-wavelength conversion portion 33 are in contact with the transparent electrode 30 on their lower surfaces being in contact with the excitation-light-emitting element 105d, and on their side surfaces being in contact with the partition wall 34e. Thus, as described in the fifth preferred embodiment, adding the function of oxygen absorption to the transparent electrode 30 can further enhance recovery of the conversion efficiency. Placing the dielectric multi-layer film 74d and AZO film 75 or a combination of these films onto the surfaces of the red-wavelength conversion portion 32d and green-wavelength conversion portion 33 adjacent to the light emitting surface 130 enables an oxygen absorption film to be disposed on the entire surfaces of the red-wavelength conversion portion 32d and green-wavelength conversion portion 33. This can achieve a very strong recovery effect.

The transparent electrode 30 may be composed of a plurality of layers. For instance, a highly conductive ITO film may be disposed on a side being in contact with the P-side layer 13, and an AZO film may be disposed, as an oxygen absorption film, on the ITO film in contact with a wavelength conversion portion.

To provide a configuration where an oxygen absorption film is disposed on the lower surface and side surface of a wavelength conversion portion as well as on the light emitting surface of the wavelength conversion portion, an oxygen absorption film such as an AZO film may be stacked onto the partition wall 34c and the transparent electrode 30 or onto the partition wall 34d and the transparent electrode 30 before the wavelength conversion portion is formed, in the fourth preferred embodiment or the fifth preferred embodiment.

As described above, the configuration of an image display element 200e can achieve an effect similar to that in the first preferred embodiment.

SUMMARY

A micro light-emitting element (100) according to a first aspect of the present invention is a micro light-emitting element that includes the following: a micro LED element (excitation-light-emitting element 105) configured to emit excitation light; and a wavelength conversion portion (red-wavelength conversion portion 32) containing a nano particle configured to absorb the excitation light to emit light having a longer wavelength than the excitation light, wherein the wavelength conversion portion has, on at least its light emitting surface, a stack of one or more layers including an oxygen absorption film (dielectric multi-layer film 74).

The foregoing configuration enables the oxygen absorption film included in the stack to absorb oxygen contained in the wavelength conversion portion, thereby preventing non-light-emission rejoining of nano particles within the wavelength conversion portion, which absorb excitation light to emit light having a longer wavelength than the excitation light. As a result, the conversion efficiency of the wavelength conversion portion can be improved, thus reducing the power consumption of the micro light-emitting element.

The micro light-emitting element (100) according to a second aspect of the present invention may be configured, in the first aspect, such that the oxygen absorption film is composed of an inorganic oxide, and such that the composition of the inorganic oxide is shifted in an oxygen deficiency direction from a stoichiometric state.

In the foregoing configuration, the inorganic oxide constituting the oxygen absorption film, which has composition shifted in an oxygen deficiency direction from a stoichiometric state, can absorb oxygen contained in the wavelength conversion portion. The inorganic oxide can be thus used suitably as an oxygen absorption film.

The micro light-emitting element (100) according to a third aspect of the present invention may be configured, in the second aspect, such that the oxygen absorption film is in an amorphous state.

In the foregoing configuration, there are typically many dangling bonds in the amorphous state, and thus, oxygen deficiency easily occurs in oxides. This enables the oxygen absorption film to further absorb oxygen contained in the wavelength conversion portion.

The micro light-emitting element (100) according to a fourth aspect of the present invention may be configured, in the second or third aspect, such that the oxygen absorption film is composed of an AZO (AZO film 75).

The foregoing configuration enables even, for instance, a thinner film than the dielectric multi-layer film including the oxygen absorption film to improve the conversion efficiency of the wavelength conversion portion.

The micro light-emitting element (100) according to a fifth aspect of the present invention may be configured, in the second or third aspect, such that the stack has a dielectric multi-layer film (74), and such that the dielectric multi-layer film includes a plurality of the oxygen absorption films.

In the foregoing configuration, the dielectric multi-layer film, which has a characteristic of reflecting excitation light emitted by the micro LED element and transmitting wavelength light, can reduce blue-light emission and increase the amount of red-light emission. Hence, providing the dielectric multi-layer film with an oxygen absorption film can improve the conversion efficiency of the wavelength conversion portion while achieving the foregoing effect.

The micro light-emitting element (100) according to a sixth aspect of the present invention may be configured, in the second or third aspect, such that the stack has an AZO film (75) in contact with the wavelength conversion portion (red-wavelength conversion portion 32) and has a dielectric multi-layer film (74) on the AZO film.

In the foregoing configuration, using an AZO film and a dielectric multi-layer film as a stack can improve the conversion efficiency of the wavelength conversion portion further than using each of them alone.

The micro light-emitting element (100) according to a seventh aspect of the present invention may be configured, in the second or third aspect, such that the stack has a dielectric multi-layer film (74) in contact with the wavelength conversion portion (red-wavelength conversion portion 32) and has an AZO film (75) on the dielectric multi-layer film.

The foregoing configuration can improve the conversion efficiency of the wavelength conversion portion further than a stack having an AZO film in contact with the wavelength conversion portion and having a dielectric multi-layer film on the AZO film.

The micro light-emitting element (100b) according to an eighth aspect of the present invention may be configured, in the first aspect, such that the oxygen absorption film is a nano particle film (76).

In the foregoing configuration, the nano particle film, which is an oxygen absorption film and is composed of an aggregation of nano particles, can increase an area for reaction with oxygen and can thus promote oxygen absorption.

In any one of the first to eighth aspects, the micro light-emitting element (100a, 100c, 100d, 100e) according to a ninth aspect of the present invention may further have a second oxygen absorption film (second AZO film 77, transparent electrode 30) in contact with a surface of the wavelength conversion portion (transparent portion 31, red-wavelength conversion portion 32 or 32d, green-wavelength conversion portion 33) being in contact with the micro LED element (excitation-light-emitting element 105).

The foregoing configuration enables an oxygen absorption film to be disposed also on a side of the wavelength conversion portion being in contact with the micro LED element. This increases a surface for placing the oxygen absorption film that comes into contact with the wavelength conversion portion, thereby further improving the conversion efficiency. As a result, the recovery of the conversion efficiency of the wavelength conversion portion can be further strengthened without incurring a large cost increase.

In any one of the first to ninth aspects, the micro light-emitting element (100a, 100e) according to a tenth aspect of the present invention may further have a third oxygen absorption film (second AZO film 77, transparent electrode 30) in contact with the side surface of the wavelength conversion portion (transparent portion 31, red-wavelength conversion portion 32 or 32d, green-wavelength conversion portion 33).

The foregoing configuration enables an oxygen absorption film to be disposed also on the side surface of the wavelength conversion portion. This increases a surface for placing the oxygen absorption film that comes into contact with the wavelength conversion portion, thereby further improving the conversion efficiency. As a result, the recovery of the conversion efficiency of the wavelength conversion portion can be further strengthened without incurring a large cost increase.

A micro light-emitting element (100) according to an eleventh aspect of the present invention is a micro light-emitting element that includes the following: a micro LED element (excitation-light emitting element 105) configured to emit excitation light; and a wavelength conversion portion (red-wavelength conversion portion 32) containing a nano particle configured to absorb the excitation light to emit light having a longer wavelength than the excitation light, wherein the wavelength conversion portion has, on at least its light emitting surface, a stack of one or more layers including an inorganic oxide thin film (dielectric multi-layer film 74), and the inorganic oxide thin film is configured to increase, over time, conversion efficiency at which the nano particle converts the excitation light into the light having a longer wavelength than the excitation light.

In the foregoing configuration, the micro light-emitting element has, on the light emitting surface of the wavelength conversion portion containing a nano particle, a stack of one or more layers including an inorganic oxide thin film that increases, over time, conversion efficiency at which the nano particle converts excitation light into light having a longer wavelength than the excitation light. The conversion efficiency of the wavelength conversion portion is thus increased by the inorganic oxide thin film over time. As a result, the power consumption of the micro light-emitting element can be reduced.

The micro light-emitting element (100) according to a twelfth aspect of the present invention may be configured, in the eleventh aspect, such that the inorganic oxide thin film (dielectric multi-layer film 74) continuously covers the light emitting surface of the wavelength conversion portion (red-wavelength conversion portion 32) entirely.

In the configuration, the inorganic oxide thin film continuously covers the light emitting surface of the wavelength conversion portion entirely, thus increasing a surface for placing the inorganic oxide thin film that comes into contact with the wavelength conversion portion, thus improving the conversion efficiency. Further, the inorganic oxide thin film can avoid oxygen intrusion and moisture intrusion from outside.

The micro light-emitting element (100) according to a thirteenth aspect of the present invention may be configured, in the eleventh or twelfth aspect, such that the composition of the inorganic oxide thin film is shifted in an oxygen deficiency direction from a stoichiometric state.

In the foregoing configuration, the inorganic oxide thin film, which has composition shifted in an oxygen deficiency direction from a stoichiometric state, can absorb oxygen contained in the wavelength conversion portion, thereby preventing non-light-emission rejoining of nano particles. This can improve the conversion efficiency of the wavelength conversion portion.

The micro light-emitting element (100) according to a fourteenth aspect of the present invention may be configured, in any one of the eleventh to thirteenth aspects, such that the inorganic oxide thin film includes an amorphous state.

In the foregoing configuration, there are typically many dangling bonds in the amorphous state, and thus, oxygen deficiency easily occurs in oxides. This enables the inorganic oxide thin film to further absorb oxygen contained in the wavelength conversion portion.

The micro light-emitting element (100) according to a fifteenth aspect of the present invention may be configured, in any one of the eleventh to fourteenth aspects, such that the inorganic oxide thin film is composed of an AZO (AZO film 75).

The foregoing configuration enables even, for instance, a thinner film than the dielectric multi-layer film including the inorganic oxide thin film to improve the conversion efficiency of the wavelength conversion portion.

The micro light-emitting element (100) according to a sixteenth aspect of the present invention may be configured, in the any one of the eleventh to fifteenth aspects, such that the stack has a dielectric multi-layer film (74), and such that the dielectric multi-layer film includes a plurality of the inorganic oxide thin films.

In the foregoing configuration, the dielectric multi-layer film, which has a characteristic of reflecting excitation light emitted by the micro LED element and transmitting wavelength light, can reduce blue-light emission and increase the amount of red-light emission. Hence, providing the dielectric multi-layer film with an inorganic oxide thin film can improve the conversion efficiency of the wavelength conversion portion while achieving the foregoing effect.

The micro light-emitting element (100) according to a seventeenth aspect of the present invention may be configured, in any one of the eleventh to sixteenth aspects, such that the stack has an AZO film (75) in a location adjacent to the wavelength conversion portion (red-wavelength conversion portion 32) and has a dielectric multi-layer film (74) on the AZO film.

In the foregoing configuration, using an AZO film and a dielectric multi-layer film as a stack can improve the conversion efficiency of the wavelength conversion portion further than using each of them alone.

The micro light-emitting element (100) according to an eighteenth aspect of the present invention may be configured, in any one of the eleventh to sixteenth aspects, such that the stack has a dielectric multi-layer film (74) in a location adjacent to the wavelength conversion portion (red-wavelength conversion portion 32) and has an AZO (75) film on the dielectric multi-layer film.

The foregoing configuration can improve the conversion efficiency of the wavelength conversion portion further than a stack having an AZO film close to the wavelength conversion portion and having a dielectric multi-layer film on the AZO film.

In any one of the eleventh to eighteenths aspects, the micro light-emitting element (100a, 100c, 100d, 100e) according to a nineteenth aspect of the present invention may further have a second inorganic oxide thin film (second AZO film 77, transparent electrode 30) in contact with a surface of the wavelength conversion portion (transparent portion 31, red-wavelength conversion portion 32 or 32d, green-wavelength conversion portion 33) being in contact with the micro LED element (excitation-light-emitting element 105).

The foregoing configuration enables an inorganic oxide thin film to be disposed also on a side of the wavelength conversion portion being in contact with the micro LED element. This increases a surface for placing the inorganic oxide thin film that comes into contact with the wavelength conversion portion, thereby further improving the conversion efficiency. As a result, the recovery of the conversion efficiency of the wavelength conversion portion can be further strengthened without incurring a large cost increase.

In any one of the eleventh to nineteenth aspects, the micro light-emitting element (00a, 100e) according to a twentieth aspect of the present invention may further have a third inorganic oxide thin film (second AZO film 77, transparent electrode 30) in contact with the side surface of the wavelength conversion portion (transparent portion 31, red-wavelength conversion portion 32 or 32d, green-wavelength conversion portion 33).

The foregoing configuration enables an inorganic oxide thin film to be disposed also on the side surface of the wavelength conversion portion. This increases a surface for placing the inorganic oxide thin film that comes into contact with the wavelength conversion portion, thereby further improving the conversion efficiency. As a result, the recovery of the conversion efficiency of the wavelength conversion portion can be further strengthened without incurring a large cost increase.

An image display element (200) according to a twenty-first aspect of the present invention is an image display element that includes the following: micro light-emitting elements (100) disposed in array; and a driving circuit substrate (50) including a driving circuit configured to supply a current to the micro light-emitting elements to cause the micro light-emitting elements to emit light, wherein each of the micro light-emitting elements includes an excitation-light-emitting element (105) configured to emit excitation light, and a wavelength conversion portion (red-wavelength conversion portion 32) configured to absorb the excitation light to emit light having a longer wavelength than the excitation light, the excitation-light-emitting element and the wavelength conversion portion are stacked in this order on the driving circuit substrate, and the micro light-emitting element emits the light having a longer wavelength than the excitation light in an upward direction that is opposite to where the driving circuit substrate is located, a partition wall (34) is disposed on the side surface of the wavelength conversion portion, and an oxygen absorption film (dielectric multi-layer film 74) is disposed on at least a light emitting surface of the wavelength conversion portion.

The foregoing configuration enables the oxygen absorption film of the micro light-emitting element included in the image display element to absorb oxygen contained in the wavelength conversion portion, thereby preventing non-light-emission rejoining within the wavelength conversion portion, which absorbs excitation light to emit light having a longer wavelength than the excitation light. As a result, the conversion efficiency of the wavelength conversion portion can be improved, thus reducing the power consumption of the micro light-emitting element, thus reducing the power consumption of the image display element.

The micro light-emitting element (100) according to a twenty-second aspect of the present invention may be configured, in the twenty-first aspect, such that the oxygen absorption film (dielectric multi-layer film 74) continuously covers the light emitting surface of the wavelength conversion portion entirely.

In the configuration, the oxygen absorption film continuously covers the light emitting surface of the wavelength conversion portion entirely, thus increasing a surface for placing the oxygen absorption film that comes into contact with the wavelength conversion portion, thus improving the conversion efficiency. Further, the oxygen absorption film can avoid oxygen intrusion and moisture intrusion from outside.

The image display element (200a) according to a twenty-third aspect of the present invention may be configured, in the twenty-first or twenty-second aspect, such that the oxygen absorption film (dielectric multi-layer film 74) is divided for each of the wavelength conversion portions (red-wavelength conversion portion 32).

The foregoing configuration can avoid an optical crosstalk that occurs via the oxygen absorption film.

The image display element (200a) according to a twenty-fourth aspect of the present invention may be configured, in the twenty-third aspect, such that the oxygen absorption film (dielectric multi-layer film 74a) divided for each of the wavelength conversion portions (red-wavelength conversion portions 32) has an end on the upper surface of the partition wall (34).

In the foregoing configuration, the oxygen absorption film divided for each of the wavelength conversion portions has an end on the partition wall, and hence, the wavelength conversion portion is not exposed on the light emitting surface. This can avoid an optical crosstalk that occurs via the oxygen absorption film, while avoiding the wavelength conversion portion from contact with external oxygen and moisture without lowering the conversion efficiency.

The image display element (200a) according to a twenty-fifth aspect of the present invention may be configured, in any one of the twenty-first to twenty-fourth aspects, such that the oxygen absorption film is composed of an inorganic oxide, and such that the composition of the inorganic oxide is shifted in an oxygen deficiency direction from a stoichiometric state.

In the foregoing configuration, the inorganic oxide constituting the oxygen absorption film, which has composition shifted in an oxygen deficiency direction from a stoichiometric state, can absorb oxygen contained in the wavelength conversion portion. The inorganic oxide can be thus used suitably as an oxygen absorption film.

The image display element (200b) according to a twenty-sixth aspect of the present invention may be configured, in the twenty-first aspect, such that the oxygen absorption film is a nano particle film (76).

In the foregoing configuration, the nano particle film, which is an oxygen absorption film and is composed of an aggregation of nano particles, can increase an area for reaction with oxygen and can thus promote oxygen absorption.

In any one of the twenty-first to twenty-sixth aspects, the image display element (200a, 200c, 200d, 200e) according to a twenty-seventh aspect of the present invention may further have a second oxygen absorption film (second AZO film 77, transparent electrode 30) in contact with a surface of the wavelength conversion portion (transparent portion 31, red-wavelength conversion portion 32 or 32d, green-wavelength conversion portion 33) being in contact with the excitation-light-emitting element (105).

The foregoing configuration enables an oxygen absorption film to be disposed also on a side of the wavelength conversion portion being in contact with the excitation-light-emitting element. This increases a surface for placing the oxygen absorption film that comes into contact with the wavelength conversion portion, thereby further improving the conversion efficiency. As a result, the recovery of the conversion efficiency of the wavelength conversion portion can be further strengthened without incurring a large cost increase.

In any one of the twenty-first to twenty-seventh aspects, the image display element (200a, 200e) according to a twenty-eighth aspect of the present invention may further have a third oxygen absorption film (second AZO film 77, transparent electrode 30) in contact with the side surface of the wavelength conversion portion (transparent portion 31, red-wavelength conversion portion 32 or 32d, green-wavelength conversion portion 33).

The foregoing configuration enables an oxygen absorption film to be disposed also on the side surface of the wavelength conversion portion. This increases a surface for placing the oxygen absorption film that comes into contact with the wavelength conversion portion, thereby further improving the conversion efficiency. As a result, the recovery of the conversion efficiency of the wavelength conversion portion can be further strengthened without incurring a large cost increase.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A micro light-emitting element comprising:
a micro light-emitting diode (LED) element configured to emit excitation light; and
a wavelength conversion portion containing a nano particle configured to absorb the excitation light to emit light having a wavelength longer than a wavelength of the excitation light,
wherein the wavelength conversion portion has, on at least a light emitting surface of the wavelength conversion portion, a stack of one or more layers comprising an oxygen absorption film that directly contacts the wavelength conversion portion,
the oxygen absorption film comprising an inorganic oxide,
a composition of the inorganic oxide is shifted in an oxygen deficiency direction from a stoichiometric state, and
the oxygen absorption film is in an amorphous state.

2. The micro light-emitting element according to claim 1, wherein the inorganic oxide comprises an aluminum-doped zinc oxide (AZO).

3. The micro light-emitting element according to claim 1, wherein the stack has a dielectric multi-layer film, and the dielectric multi-layer film comprises a plurality of oxygen absorption films, including the oxygen absorption film.

4. The micro light-emitting element according to claim 1, wherein the stack has an aluminum-doped zinc oxide (AZO) film in contact with the wavelength conversion portion and has a dielectric multi-layer film on the AZO film.

5. The micro light-emitting element according to claim 1, wherein the stack has a dielectric multi-layer film in contact with the wavelength conversion portion and has an aluminum-doped zinc oxide (AZO) film on the dielectric multi-layer film.

6. A micro light-emitting element comprising:
a micro light-emitting diode (LED) element configured to emit excitation light; and
a wavelength conversion portion containing a nano particle configured to absorb the excitation light to emit light having a wavelength longer than a wavelength of the excitation light,
wherein the wavelength conversion portion has, on at least a light emitting surface of the wavelength conversion portion, a stack of one or more layers comprising an inorganic oxide thin film that directly contacts the wavelength conversion portion,
the inorganic oxide thin film is configured to increase, over time, conversion efficiency at which the nano particle converts the excitation light into the light having the wavelength longer than the wavelength of the excitation light,
a composition of the inorganic oxide thin film is shifted in an oxygen deficiency direction from a stoichiometric state, and
the inorganic oxide thin film is in an amorphous state.

7. The micro light-emitting element according to claim 6, wherein the inorganic oxide thin film continuously covers an entirety of the light emitting surface of the wavelength conversion portion.

8. The micro light-emitting element according to claim 6, wherein the inorganic oxide thin film comprises an aluminum-doped zinc oxide (AZO).

9. The micro light-emitting element according to claim 6, wherein the stack has a dielectric multi-layer film, and the dielectric multi-layer film comprises a plurality of inorganic oxide thin films, including the inorganic oxide thin film.

10. The micro light-emitting element according to claim 6, wherein the stack has an aluminum-doped zinc oxide (AZO) film in a location adjacent to the wavelength conversion portion and has a dielectric multi-layer film on the AZO film.

11. The micro light-emitting element according to claim 6, wherein the stack has a dielectric multi-layer film in a location adjacent to the wavelength conversion portion and has an aluminum-doped zinc oxide (AZO) film on the dielectric multi-layer film.

12. An image display element comprising:
a plurality of micro light-emitting elements disposed in an array; and
a driving circuit substrate comprising a driving circuit configured to supply a current to the plurality of micro light-emitting elements to cause the plurality of micro light-emitting elements to emit light,
wherein each of the plurality of micro light-emitting elements comprises an excitation-light-emitting element configured to emit excitation light, and a wavelength conversion portion configured to absorb the excitation light to emit light having a wavelength longer than a wavelength of the excitation light,
the excitation-light-emitting element and the wavelength conversion portion are stacked in this order on the driving circuit substrate, and each micro light-emitting element emits the light having the wavelength longer than the wavelength of the excitation light in an upward direction that is opposite to where the driving circuit substrate is located,
a partition wall is disposed on a side surface of the wavelength conversion portion,
a first oxygen absorption film is disposed in direct contact with a light emitting surface of the wavelength conversion portion,
a second oxygen absorption film is disposed between the wavelength conversion portion and the excitation-light-emitting element, the second oxygen absorption film being in direct contact with a lower surface of the wavelength conversion portion, and
a third oxygen absorption film is disposed between the wavelength conversion portion and the partition wall, the third oxygen absorption film being in direct contact with the side surface of the wavelength conversion portion.

13. The image display element according to claim 12, wherein the first oxygen absorption film continuously covers an entirety of the light emitting surface of the wavelength conversion portion.

14. The image display element according to claim 12, wherein the first oxygen absorption film is divided for each of a plurality of wavelength conversion portions, including the wavelength conversion portion.

15. The image display element according to claim 12, wherein
the first oxygen absorption film comprises an inorganic oxide, and
a composition of the inorganic oxide is shifted in an oxygen deficiency direction from a stoichiometric state.

16. The image display element according to claim 12, wherein the first oxygen absorption film, the second oxygen absorption film, and the third oxygen absorption cover an entire perimeter of the wavelength conversion portion.

* * * * *